United States Patent
Takashima et al.

(10) Patent No.: US 7,252,570 B2
(45) Date of Patent: Aug. 7, 2007

(54) MANUFACTURING METHOD FOR ORGANIC ELECTROLUMINESCENCE DEVICE, AND ELECTRONIC DEVICE THEREWITH

(75) Inventors: Takeshi Takashima, Fujimi-cho (JP); Shuichi Takei, Shimosuwa-machi (JP); Katsuyuki Morii, Suwa (JP); Hirofumi Hokari, Chino (JP); Rie Makiura, Suwa (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 223 days.

(21) Appl. No.: 10/758,649

(22) Filed: Jan. 16, 2004

(65) Prior Publication Data

US 2004/0207312 A1    Oct. 21, 2004

(30) Foreign Application Priority Data

| Jan. 23, 2003 | (JP) | ............................. 2003-015102 |
| Sep. 1, 2003 | (JP) | ............................. 2003-308968 |

(51) Int. Cl.
*H01L 51/40* (2006.01)
*H01L 51/30* (2006.01)
*H01L 51/10* (2006.01)

(52) U.S. Cl. ....................... 445/24; 313/504; 313/506; 428/690; 428/917

(58) Field of Classification Search ................. 445/24; 313/504, 506
See application file for complete search history.

(56) References Cited

U.S. PATENT DOCUMENTS

| 6,451,457 | B1* | 9/2002 | Taguchi ...................... 428/690 |
| 6,631,147 | B2* | 10/2003 | Taniguchi et al. ............. 372/39 |
| 7,102,280 | B1 | 9/2006 | Duineveld et al. |

| 2001/0001050 | A1* | 5/2001 | Miyashita et al. ........... 428/690 |
| 2001/0051284 | A1 | 12/2001 | Ueda et al. |
| 2002/0028349 | A1* | 3/2002 | Seo ............................. 428/690 |

(Continued)

FOREIGN PATENT DOCUMENTS

CN    1345469 A    4/2002

(Continued)

OTHER PUBLICATIONS

Gustafsson et al, Letters to Nature, vol. 357, 1992, pp. 477-479.

(Continued)

*Primary Examiner*—Karabi Guharay
(74) *Attorney, Agent, or Firm*—Oliff & Berridge, PLC

(57) ABSTRACT

According to the manufacturing method for an organic electroluminescence device comprising luminescent layers between an anode and a cathode, electron transport layer forming materials are introduced in the liquid phase process so as to form electron transport layers. First materials composed of prescribed elements, such as halides (e.g., LiF) or oxides of alkali metals, alkali earth metals, and rare earth metals, are introduced into openings of organic bank layers so as to form electron transport layers on blue-color luminescent layers realizing blue-color emission; and second materials composed of organic metallic complex (e.g., β-diketone complex), generally expressed in a chemical formula $MA_n$ using a center atom M (e.g. Ca) and a ligand A (e.g., acetylacetone (acac)), are introduced into openings of organic bank layers so as to form electron transport layers on red-color and green-color luminescent layers realizing red-color and green-color emission.

7 Claims, 11 Drawing Sheets

U.S. PATENT DOCUMENTS

| | | | |
|---|---|---|---|
| 2002/0130612 A1* | 9/2002 | Morrissy et al. | 313/505 |
| 2003/0077480 A1* | 4/2003 | Hosokawa et al. | 428/690 |
| 2004/0004214 A1* | 1/2004 | Yamazaki et al. | 257/40 |
| 2004/0119406 A1* | 6/2004 | Kobayashi | 313/506 |
| 2004/0169462 A1* | 9/2004 | Sasaki | 313/503 |

FOREIGN PATENT DOCUMENTS

| | | |
|---|---|---|
| JP | A 10-12377 | 1/1998 |
| JP | A 2000-252076 | 9/2000 |
| JP | A 2000-252079 | 9/2000 |

OTHER PUBLICATIONS

J.C. Carter et al., "Operating stability of light-emitting polymer diodes based on poly (*p*-phenylene vinylene)", Applied Physics Letter. 71, 1997, pp. 34-35.

L.S. Hung et al., "Enhanced electron injection in organic electroluminescence devices using an Al/LiF electrode", Applied Physics Letter. 70, 1997, pp. 152-154.

"Explication for Dispersion and Aggregation, and Applied Technology Therefor." (1992) pp. 30.

* cited by examiner

MANUFACTURING METHOD FOR ORGANIC ELECTROLUMINESCENCE DEVICE, AND ELECTRONIC DEVICE THEREWITH

BACKGROUND OF THE INVENTION

1. Field of the Invention

This invention relates to manufacturing methods for organic electroluminescence (EL) devices, and also relates to electronic devices using them.

This application claims priority on Japanese Patent Application No. 2003-15102 and Japanese Patent Application No. 2003-308968, the contents of which are incorporated herein by reference.

2. Description of the Related Art

In general, organic electroluminescence (EL) components adapted to organic electroluminescence devices have structures in which organic luminescent materials are arranged as thin films sandwiched between anodes and cathodes (or positive electrodes and negative electrodes), wherein electrons and holes injected by both electrodes are reunified in luminescent layers, thus causing excitation of energy to emit light. These organic electroluminescence devices have relatively high charge injection barriers between electrodes and luminescent layers. For this reason, they normally use the laminated structure comprising hole transport layers (or hole injection layers) serving as anode buffer layers and electron transport layers (or electron injection layers) serving as cathode buffer layers. In this laminated structure, the electron transport layer is in particular composed of lithium fluoride (LiF) or magnesium oxide (MgO), whereby it is possible to produce an organic electroluminescence device actualizing low-voltage drive. This is disclosed on page 152 of Applied Physics Letters, Vol. 70 (1997), for example.

Presently, organic luminescent materials used for electroluminescence devices are mainly classified into two groups, namely, a low-molecular group and a high-molecular (or polymer) group. Organic luminescent materials of the low-molecular group are normally subjected to the gaseous phase process such as vacuum evaporation to form thin films, which are then subjected to patterning using masks. This is disclosed on page 34 of Applied Physics Letters, Vol. 51 (1997), for example. Organic luminescent materials of the polymer group can be dissolved in solvents, so that they are subjected to the application method (or coating method) to form films, which are then subjected to patterning by the liquid-drop discharge method such as the inkjet method. This is disclosed on page 34 of Applied Physics Letters, Vol. 71 (1997), for example. Manufacturing methods for an organic electroluminescence device formed by the liquid-drop discharge method are known, an example of which is disclosed in Japanese Patent Application Publication No. Hei 10-12377.

Materials that can be subjected to the application method to form film have been developed with respect to hole transport layers serving as anode buffer layers, which allows formation of films by a gaseous process. This is disclosed in the article on page 477 of Nature, Vol. 357 (1992).

The vacuum evaporation method is normally used for the formation of films with respect to electron transport layers serving as cathode buffer layers. However, this may increase the manufacturing cost in terms of energy consumption and supply of materials. In addition, this may cause an unwanted factor interfering enlargement of sizes of substrates for organic electroluminescence devices, which will be practically used and incorporated into displays in the future. When organic electroluminescence devices are formed by the gaseous process, organic substance beds or substrates must be exposed to high-temperature environments; therefore, various problems such as deterioration of luminescence characteristics and deformation of substrates may occur in the case of prescribed materials having poor heat resistance.

When electron transport layers are formed on luminescent layers in the liquid phase, luminescent layers serving as beds therefor must be dissolved due to some solvent actually used.

Various examples have been developed with respect to the formation of cathode buffer layers (serving as electron transport layers) in the liquid phase process. For example, Japanese Patent Application Publication No. 2000-252076 discloses the method in which layers are formed by the wet method using polymers having electron transportability (where one to five alkyl or alkoxyl elements are included in each repeat unit) that are dissolved or dispersed. In addition, Japanese Patent Application Publication No. 2000-252079 discloses the method in which electron injection layers are formed by the wet method using the solution (or dispersed solution) in which tetrahydro-aluminate elements are dissolved or dispersed.

The conventional examples regarding the formation of electron transport layers in the liquid phase process fail to disclose the formation of electron transport layers that are formed in the liquid phase process using alkali metals and alkali earth metals, which produce good results in the conventional gaseous process, as well as halides (e.g., LiF) and oxides of rare earth metals.

SUMMARY OF THE INVENTION

It is an object of the invention to provide a manufacturing method for an organic electroluminescence device in which prescribed layers are formed in the liquid phase process using alkali metals and alkali earth metals, which produce good results in the conventional gaseous process, as well as halides (e.g., LiF) and oxides of rare earth metals.

It is another object of the invention to provide an electronic device using the aforementioned organic electroluminescence device.

An organic electroluminescence device basically comprises luminescent layers arranged between an anode and a cathode, which are arranged opposite to each other. According to the manufacturing method of this invention, electron transport layer forming materials are introduced in the liquid phase process so as to form electron transport layers, which are arranged between the luminescent layers and the cathode. Specifically, two types of electron transport layer forming materials are introduced in accordance with the liquid-drop discharge method, by which the corresponding liquid drops are selectively located and discharged at prescribed positions inside of openings of organic bank layers arranged on or above pixel electrodes. That is, first materials composed of prescribed elements, which are selected from among halides (e.g., LiF) or oxides of alkali metals, alkali earth metals, and rare earth metals, are introduced into openings of organic bank layers so as to form electron transport layers on blue-color luminescent layers realizing blue-color emission; and second materials composed of organic metallic complex (e.g., $\beta$-diketone complex), which can be generally expressed in a chemical formula of $MA_n$ (where M denotes a center atom (e.g., Ca); A denotes a ligand (e.g., acetylacetone (acac)); and n denotes valence number of the center atom M), are introduced into openings of organic bank layers so as to form electron transport layers on red-color and green-color luminescent layers realizing red-color and green-color emission.

The manufacturing method of the aforementioned organic electroluminescence device comprises numerous steps; specifically, a polysilicon layer is formed on a substrate via a surface protective layer and is then subjected to patterning to form silicon layers, which are covered with a gate insulating layer and for which source and drain regions are formed, while the overall surface of the gate insulating layer is covered with a conductive layer; gate electrodes are formed by patterning together with cathode power supply lines; ion implantation is performed using masks to dope impurities into the silicon layers; the overall surface of the substrate is covered with a first interlayer insulating layer, which is subjected to patterning by photolithography so as to form contact holes at prescribed positions in correspondence with source and drain electrodes; the first interlayer insulating layer is covered with a conductive layer, which is then subjected to patterning using masks to form source and drain electrodes; the first interlayer insulating layer is covered with a second interlayer insulating layer in which contact holes are formed by etching in correspondence with drain electrodes; the overall surface of the substrate is covered with a transparent conductive layer, which is then subjected to patterning to form pixel electrodes and dummy patterns; the pixel electrodes and dummy patterns are covered with a lyophilic control layer; organic bank layers are formed by photolithography or etching at prescribed positions of the lyophilic control layer and are then subjected to plasma treatment; hole transport layers are formed by liquid-drop discharging, drying, and heating; luminescent layers are formed by liquid-drop discharging, drying, and heating inside of openings of the organic bank layers; electron transport layers are formed by liquid-drop discharging, drying, and heating inside of the openings of the organic bank layers; a cathode is formed using aluminum by evaporation or sputtering, and an encapsulating substrate is formed to encapsulate components and elements on the substrate; and the space between the encapsulating substrate and the substrate is finally enclosed using an enclosing resin such as a thermosetting resin and an ultraviolet-setting resin in the inert gas atmosphere.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings.

Before specifically describing a manufacturing method for an organic electroluminescence device in accordance with this invention, the wiring structure adapted to the organic electroluminescence device will be described with reference to FIG. 1.

Figure 1:
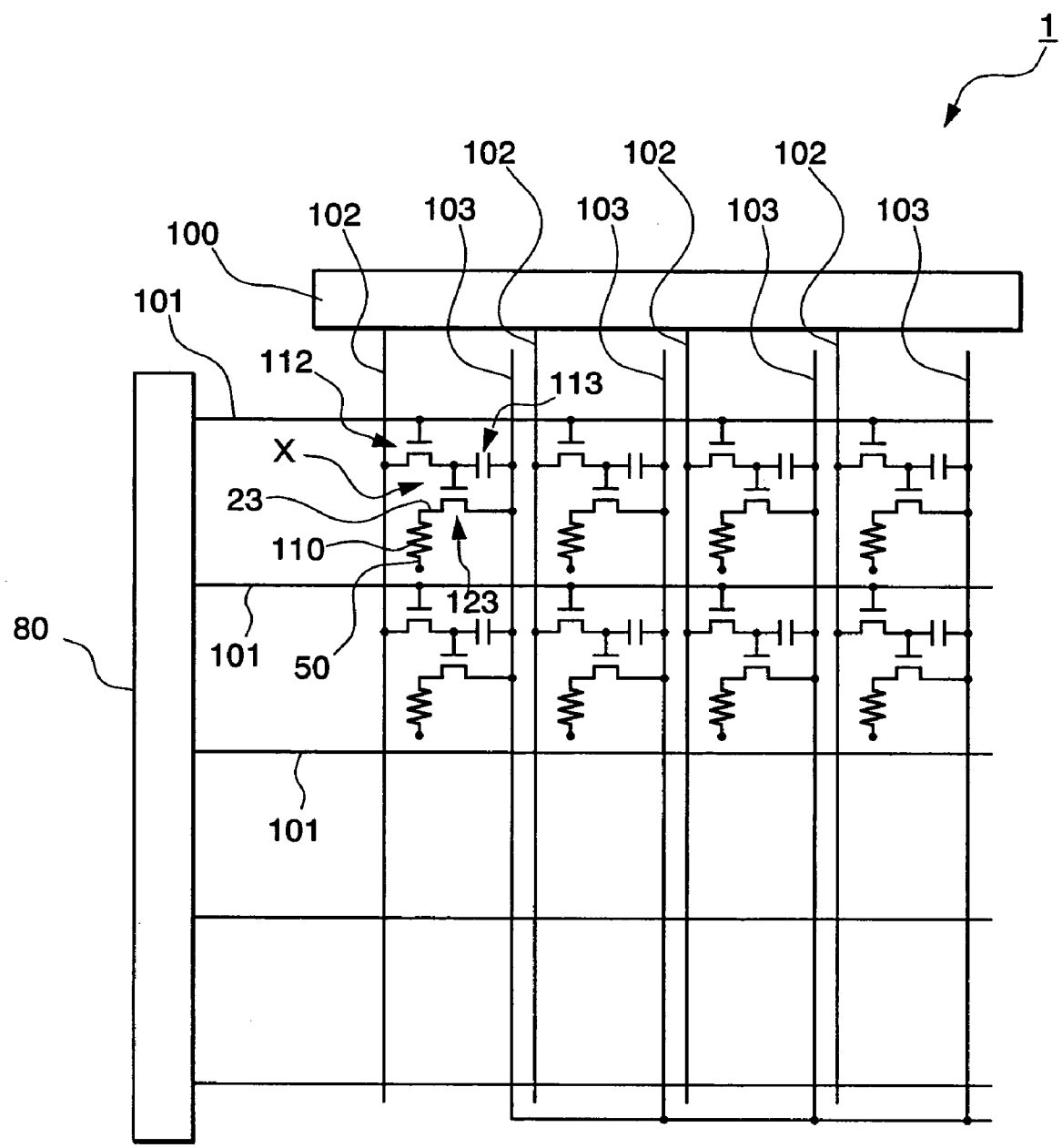
FIG. 1 is a circuit diagram showing the wiring structure of an organic electroluminescence device in accordance with a preferred embodiment of the invention.

FIG. 1 is a simple wiring diagram showing an organic electroluminescence device 1 of an active matrix type using thin film transistors (TFTs) as switching elements.

The organic electroluminescence device 1 of FIG. 1 comprises a plurality of scan lines 101 and a plurality of signal lines 102, which are wired to rectangularly intersect each other, as well as a plurality of power supply lines 103 that are wired in parallel with the signal lines 102. In addition, pixel regions X are arranged in proximity to intersecting points between the scan lines 101 and the signal lines 102 respectively.

All the signal lines 102 are connected with a data line drive circuit 100 comprising shift registers, level shifters, video lines, and analog switches. All the scan lines 101 are connected with a scan line drive circuit 80 comprising shift registers and level shifters.

Each of the pixel regions X provides a switching TFT 112 whose gate electrode is supplied with a scanning signal via the scan line 101, a capacitance element 113 for holding a pixel signal supplied from the signal line 102 via the switching TFT 112, a driving TFT 123 whose gate electrode is supplied with the pixel signal held by the capacitance element 113, a pixel electrode (i.e., an anode) into which a drive current flows from the power supply line 103 when electrically connected with the power supply line 103 via the driving TFT 123, and a function layer 110 that is sandwiched between the pixel electrode 23 and a cathode 50. A luminescence component (i.e., an organic electroluminescence component) is constituted by the pixel electrode 23, cathode 50, and function layer 110.

In the organic electroluminescence device 1, when the scan line 101 is driven to turn on the switching TFT 112, an electric potential of the signal line 102 is held by the capacitance element 113, so that on/off states of the driving TFT 123 depends upon the state of the capacitance element 113. Then, a current flows from the power supply line 103 to the pixel electrode 23 via a channel of the driving TFT 123, and it further flows into the cathode 50 via the function layer 110. Thus, the function layer 110 emits light in response to an amount of current flowing therethrough.

Next, the structure of the organic electroluminescence device 1 will be described with reference to FIGS. 2 to 5.

Figure 2:
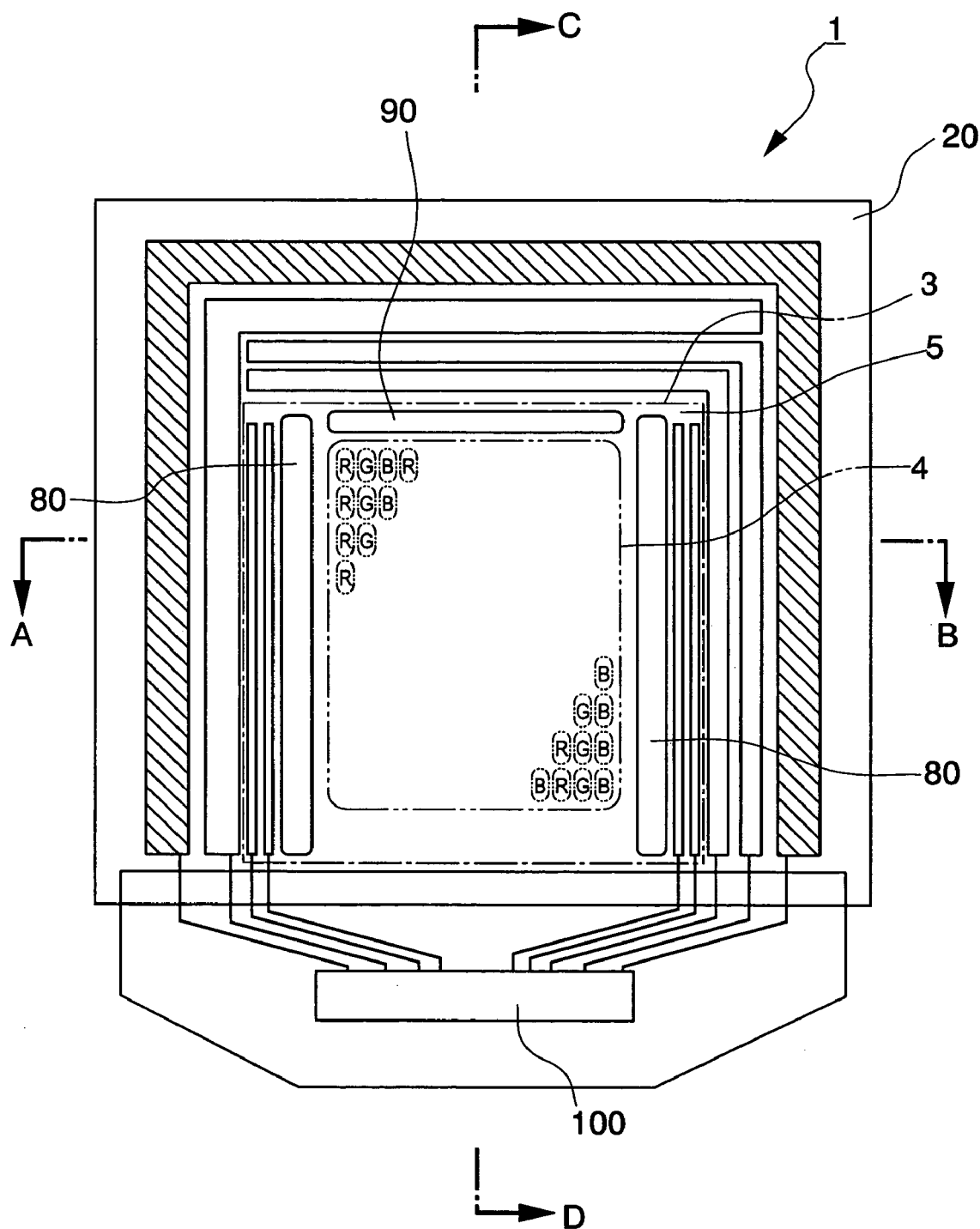
FIG. 2 is a plan view diagrammatically showing the layout and structure of the organic electroluminescence device.

As shown in FIG. 2, the organic electroluminescence device 1 comprises a substrate 20 having light transmission ability and electrical insulation ability, a pixel electrode area (not shown) in which pixel electrodes connected with switching TFTs (not shown) are arranged in a matrix form on the substrate 20, power supply lines (not shown) that are arranged in the periphery of the pixel electrode regions and are connected with the pixel electrodes, and a pixel portion 3 having a substantially rectangular shape in plan view (encompassed by single-dashed lines in FIG. 2) that is located on or above the pixel electrode region. In addition, the pixel portion 3 is partitioned into a real display area 4 (encompassed by double-dashed lines in FIG. 2) located at the center area thereof, and a dummy area 5 (defined between single-dashed lines and double-dashed lines) that is arranged in the periphery of the real display area 4.

Numerous display regions R, G, and B (representing red, green and blue colors) having electrodes respectively are arranged in the real display area 4 in such a way that they are independently separated from each other in A-B directions and C-D directions.

A pair of scan line drive circuits 80 are arranged on both sides of the real display area 4 and are arranged beneath the dummy area 5.

An inspection circuit 90 is arranged in the upper side of the real display area 4 in order to inspect operating conditions of the organic electroluminescence device 1. It comprises an inspection information output means (not shown) for outputting inspection results to an external device and the like. Thus, it is possible to perform inspection as to the quality and defects of the display device while manufactured or when forwarded to shipment. The inspection circuit 90 is arranged beneath the dummy area 5.

A power supply unit (not shown) applies drive voltages to the scan line drive circuits 80 and the inspection circuit 90 via drive voltage conductors 310 (see FIG. 3) and drive voltage conductors 340 (see FIG. 4) respectively. In addition, a main driver (not shown) for controlling the overall operation of the organic electroluminescence device 1 transmits and applies drive control signals and drive voltages to the scan line drive circuits 80 and the inspection circuit 90 via drive control signal conductors 320 (see FIG. 3) and drive voltage conductors 350 (see FIG. 4) respectively. Herein, drive control signals are instruction signals from the main driver, which are related to controls for the scan line drive circuits 80 and the inspection circuit 90 to output signals.

Figure 3:
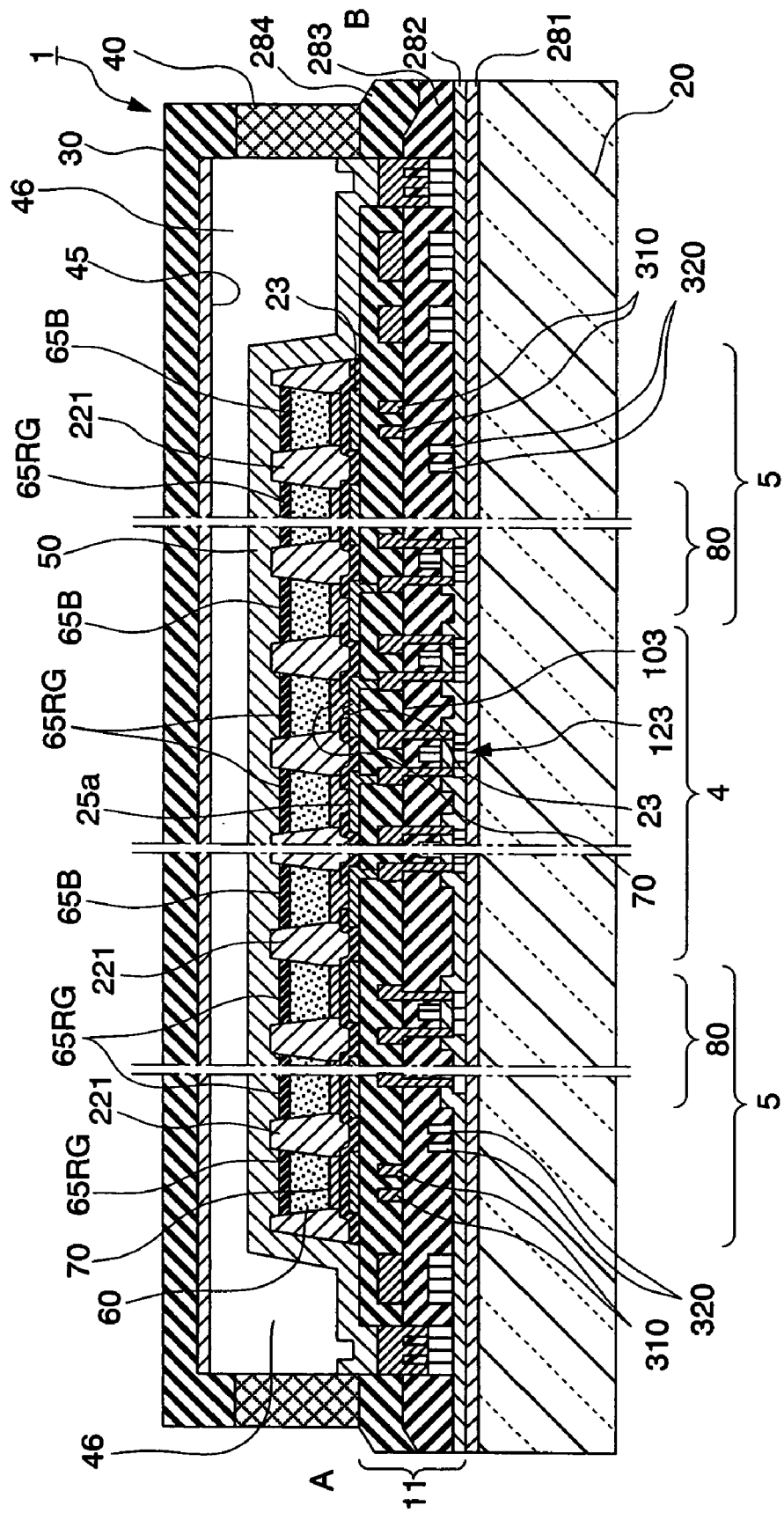
FIG. 3 is a cross sectional view taken along line A-B in FIG. 2.
Figure 4:
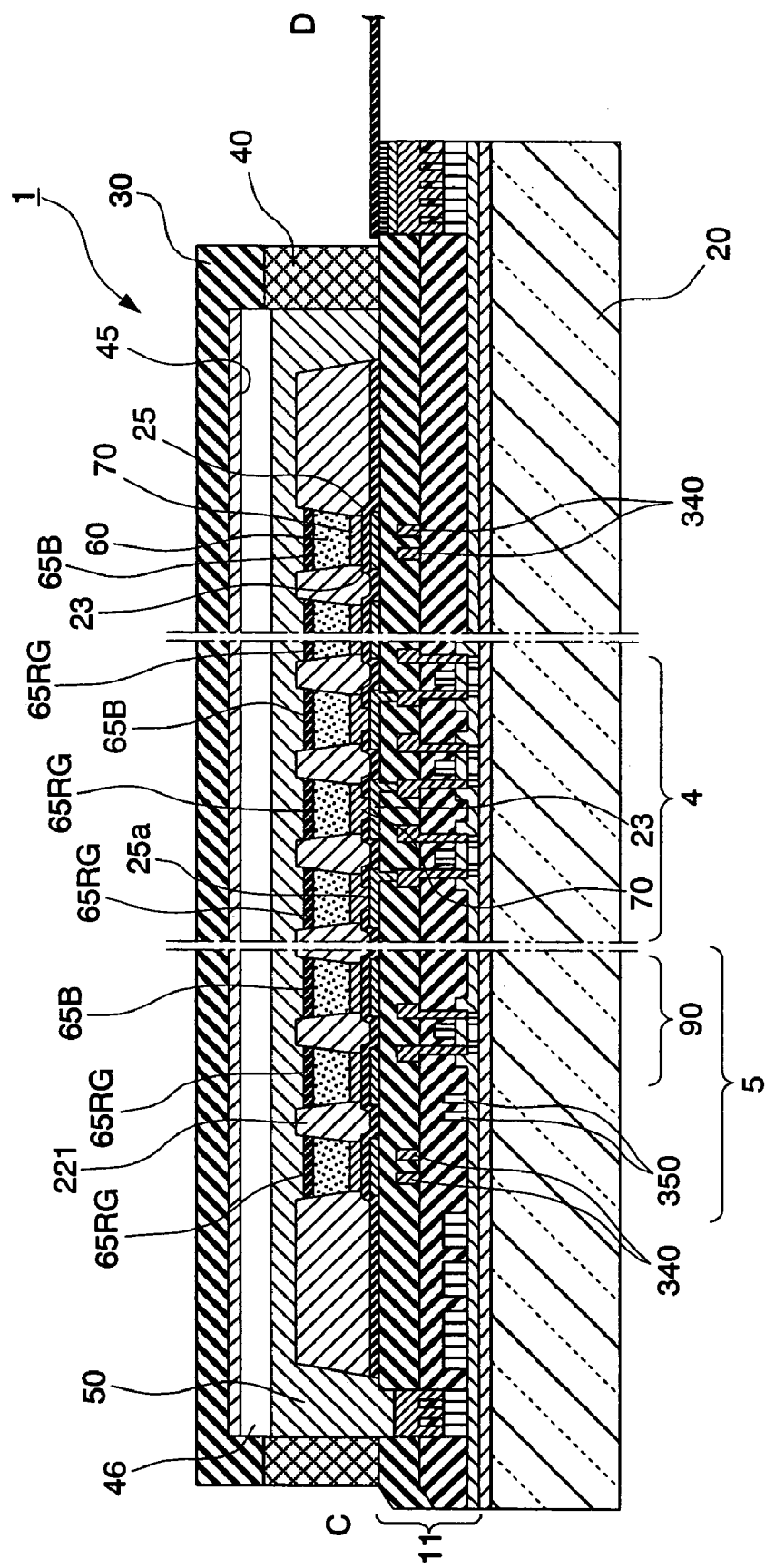
FIG. 4 is a cross sectional view taken along line C-D in FIG. 2.

As shown in FIGS. 3 and 4, the overall structure of the organic electroluminescence device 1 is constituted by joining together a substrate 20 and an encapsulating substrate 30 via an enclosing resin 40. In the space encompassed by the substrate 20, the encapsulating substrate 30, and the enclosing resin 40, a dryer (or a drying agent) 45 is bonded onto the interior wall of the encapsulating substrate 30. This space is filled with nitrogen gas to form a nitrogen gas filled layer 46. Due to the aforementioned structure, it is possible to reliably prevent water content and oxygen from infiltrating into the inside of the organic electroluminescence device 1. Thus, it is possible to increase the lifetime of the organic electroluminescence device 1. Incidentally, it is possible to replace the dryer 45 with a getter (agent), for example.

In the case of an organic electroluminescence device of a so-called top emission type, emitted light is output from the encapsulating substrate 30 arranged opposite to the substrate 20; therefore, it is possible to use either a transparent substrate or an opaque substrate for the substrate 20. Various examples can be listed as the opaque substrate, for example, a substrate in which an insulating process such as the surface oxidation is performed on a ceramic material made of alumina or a metal sheet made of stainless steel, and a substrate made of a thermosetting resin or a thermoplastic resin.

In the case of an organic electroluminescence device of the so-called back emission type, emitted light is output from the substrate 20; therefore, it is possible to use either a transparent substrate or a semitransparent substrate for the substrate 20. For example, it is possible to list prescribed materials such as glass, quartz, and resin (e.g., plastics, and plastic films) for the substrate 20, wherein a glass substrate is preferably used in particular. The present embodiment is of the back emission type in which emitted light is output from the substrate 20; therefore, the transparent or semi-transparent substrate is used as the substrate 20.

In addition, it is possible to use a plate-like member having an electrically insulating ability for the encapsulating substrate 30, for example. Furthermore, the enclosing resin 40 is made of a thermosetting resin or an ultraviolet-setting resin, for example. In particular, it is preferable to use an epoxy resin, which is one type of the thermosetting resin, for the enclosing resin 40.

Figure 5:
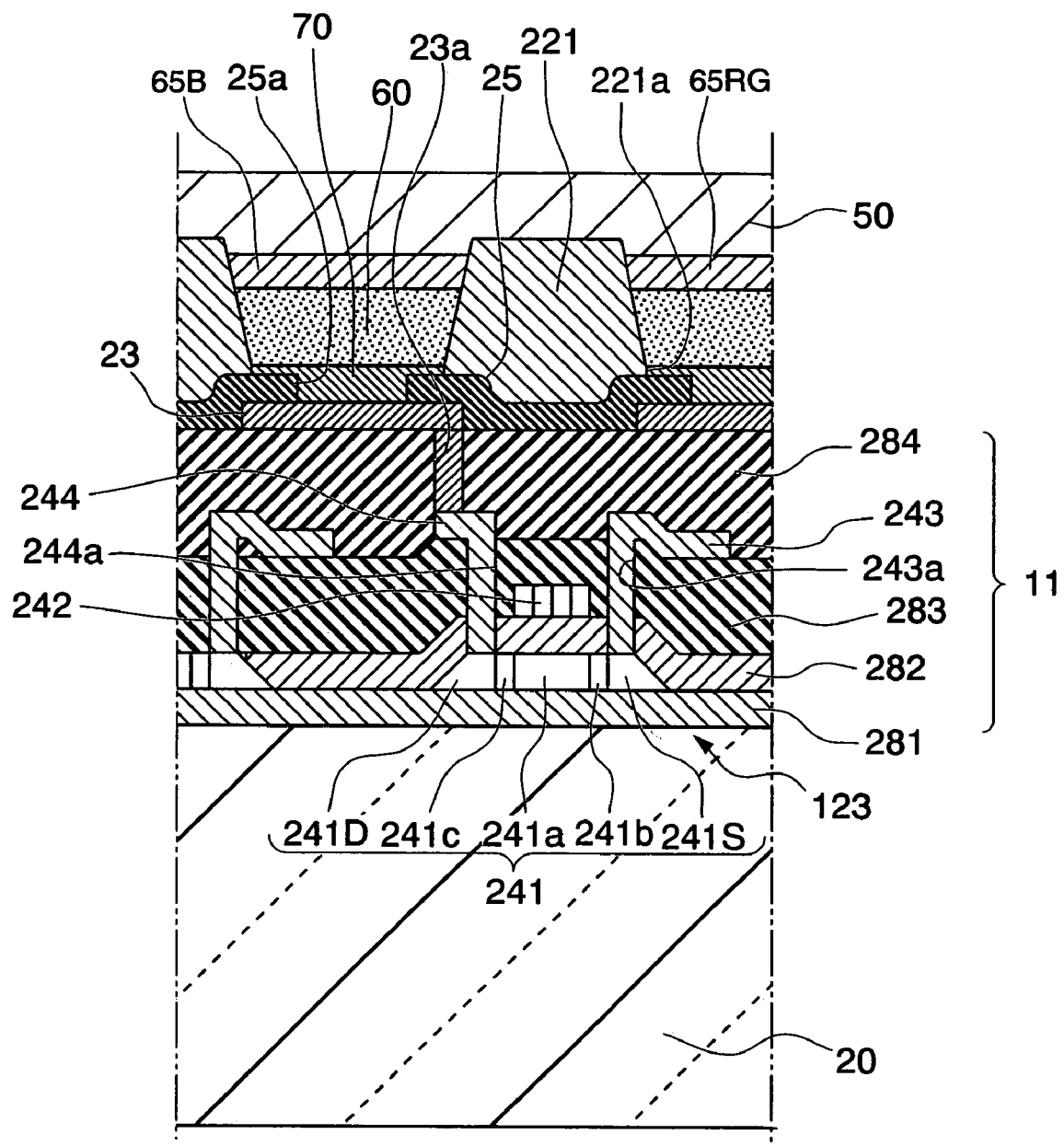
FIG. 5 is an enlarged view showing essential parts of the cross-sectional structure shown in FIG. 3.

A circuit layer 11 including the driving TFTs 123 for driving the pixel electrodes 23 is formed on the substrate 20. Luminescent components (e.g., organic electroluminescence components) are arranged on the circuit layer 11. As shown in FIG. 5, the luminescent component is constituted by sequentially forming a pixel electrode 23 serving as an anode, a hole transport layer 70 for injecting or transporting holes from the pixel electrode 23, a luminescent layer 60 comprising organic electroluminescent substance, which is one type of the electroluminescent substances, and a cathode 50.

As shown in FIG. 2, the organic electroluminescence device 1 provides three types of luminescent dots, i.e., red (R), green (G), and blue (B) dots, in the real display area 4, thus actualizing a full-color display. An enlarged view is shown in FIG. 5 in which electron transport layers 65B and 65RG for injecting or transporting electrons from the cathode 50 are respectively formed between the luminescent layer 60 and the cathode 50. Herein, the electron transport layer 65B is formed for a blue (B) color illuminating dot (namely, a blue dot), and the electron transport layer 65RG is formed for red (R) color and green (G) color illuminating dots. This copes with height differences of charge injection barriers between the cathode 50 and the luminescent layer 60 illuminating red, green, and blue colors. That is, prescribed electron transport materials are adopted in red, green, and blue colors, actualized by the luminescent layer 60, in order to raise the luminescence efficiency.

In the luminescent component having the aforementioned structure, holes injected from the hole transport layer 70 are coupled with electrons from the cathode 50 in the luminescent layer 60, which is thus activated to cause light emission. Specifically, an electron from the cathode 50 is transported into the luminescent layer 60 via the electron transport layer 65B with respect to a blue dot. With respect to red and green dots, electrons from the cathode 50 are transported into the luminescent layer 60 via the electron transport layer 65RG. Thus, it is possible to further increase the electron transport efficiency.

In the present embodiment that is of the back emission type, the pixel electrode 23 serving as the anode is formed using a prescribed transparent conductive material, for which indium-tin oxide (ITO) can be preferably used. In addition, it is possible to use other materials such as amorphous transparent conductive films composed of prescribed elements regarding indium oxide and zinc oxide (namely, 'IZO' which is a registered trademark, produced by Idemitsu-Kosan Co., Ltd.), for example. For the sake of convenience, the present embodiment uses ITO; instead, it is possible to use other elements such as Pt, Ir, Ni, and Pd.

It is preferable that the pixel electrode 23 has a prescribed thickness ranging from 50 nm to 200 nm, wherein it is preferable to set the thickness to approximately 150 nm. Oxygen ($O_2$) plasma processing is performed on the surface of the ITO serving as the pixel electrode 23, whereby a lyophilic characteristic is applied to the pixel electrode 23, which is also cleaned on the surface and is adjusted in work function. The $O_2$ plasma processing is performed under prescribed conditions in which plasma power ranges from 100 kW to 800 kW, oxygen gas flow ranges from 50 m/min to 100 ml/min, substrate carrying speed ranges from 0.5 mm/sec to 10 mm/sec, and substrate temperature ranges from 70° C. to 90° C.

The hole transport layer 70 is formed using the material in which polystyrene sulfonic acid is added to polythiophene derivative or polypyrrole derivative. Specifically, as the material used for the formation of the hole transport layer 70, it is preferable to use the dispersion solution mixing 3,4-polyethylene diothiophene (PEDOT) and polystyrene sulfonic acid (PSS) at a mixing ratio of PEDOT/PSS=1/20 (product name: Bytron-p produced by Byer Co. Ltd.), that is, the dispersion solution in which 3,4-polyethylene diothiophone is dispersed in polystyrene sulfonic acid serving as a dispersion medium and is further dispersed into water serving as a polar solvent (or dispersion medium).

As the polar solvent (or dispersion medium), it is possible to use prescribed substances, instead of water, such as isopropyl alcohol (IPA), normal butanol, γ-butyrolactone, N-methyl-pyrolidone (NMP), 1-, 3-dimethyl-2-imidazolidinone (DMI) and derivatives thereof as well as carbitol-acetate and glycolic ether such as butyl-carbitol-acetate.

The material used for the formation of the hole transport layer is not necessarily limited to the aforementioned ones; hence, it is possible to use various kinds of elements. For example, it is possible to use the dispersion solution in which a prescribed element such as polystyrene, polypyrrole, polyaniline, polyacetylene and derivatives thereof are dispersed into an appropriate dispersion medium such as polystyrene sulfonic acid.

As the material used for the formation of the luminescent layer 60, it is possible to use known luminescent materials capable of generating fluorescence or phosphorescence. Specifically, it is possible to use a prescribed polymer such as (poly)-paraphenylene-vinylene derivative, polyphenylene derivative, polyfluorene derivative, polyvinyl-carbazole, polythiophene derivative, perylene pigment, coumalin pigment, and rhodamine pigment; or it is possible to use a prescribed element realized by doping rubrene, penylene, 9-, 10-diphenylanthracene, tetraphenylbutadiene, Nile red, coumalin 6, or quinacridone into the aforementioned polymers, for example.

As the solvent liquefying the aforementioned materials, a prescribed nonpolar solvent insoluble to the hole transport layer 70 is used in order to avoid re-dissolution of the hole transport layer 70. In particular, in the case in which the application of the material used for the formation of the luminescent layer is performed by the liquid-drop discharge method such as the inkjet method (details of which will be described later), as the aforementioned nonpolar solvent, it is preferable to use dihydro-benzofuran, trimethylbenzene, tetramethylbenzene, cyclohexylbenzene, or their mixture. In the case in which the application is performed by the spin-coat method or dip method, it is preferable to use toluene, xylene, and the like.

Next, the electron transport layer 65B formed on the blue luminescent layer and the electron transport layer 65RG formed on the red-and-green luminescent layer will be described in detail.

The electron transport layer 65RG is formed using a prescribed material such as alkali metal, alkali earth metal, and halide or oxide of rare earth metal. For example, a prescribed element such as Li, Na, and Cs is used for the alkali metal; a prescribed element such as Ca, Ba, and Sr is used for the alkali earth metal; and a prescribed element such as Sm, Tb, and Er is used for the rare earth metal. These metals are preferably transformed into fluoride. Alternatively, they can be transformed into other halides (i.e., chlorides and bromides) or oxides.

Among compounds used as the material for the electron transport layer 65B, prescribed compounds allowing evaporation using LiF and the like can be transformed into micro particulates whose diameters are 1 μm or less by the gaseous evaporation method such as the solvent trap method and cold trap method, details are disclosed in the paper entitled "explication for dispersion and aggregation, and applied technology therefor" (1992), page 30, for example. That is, micro particulates are uniformly dispersed in the dispersion medium so as to produce the dispersion solution (or colloid). This allows application to be performed by the liquid-drop discharge method; that is, this allows film formation to be realized in the liquid phase process.

It is preferable that the thickness of the electron transport layer 65B made of the aforementioned compound range from 0.5 nm to 10 nm; in particular, it is preferable to form a very thin film having a thickness of 5 nm or less. In addition, it is preferable to form the electron transport layer 65B by the liquid-drop discharge method such as the inkjet method (details of which will be described later) because in the case of the application of the dispersion solution, a thin film can be formed at a thickness on the order of several nano meters. Furthermore, as the dispersion medium used for the dispersion of the aforementioned micro particulates, it is preferable to use water, methanol, ethanol, propanol, isopropyl alcohol (IPA), and polar solvent such as dimethylketone because these elements do not cause re-dissolution of the luminescent layer 60.

In an exceptional case in where the luminescent layer 60 is dissolved into the polar solvent, it is preferable to use a nonpolar solvent such as toluene, xylene, benzene, hexane, cyclohexane, tetradecane, and iso-octane.

Among the materials that can be used for the formation of the electron transport layer 65B, some fluorides including Na, K, Rb, and Cs show water solubility. They are solubilized by being dissolved into the polar solvent (or nonpolar solvent exceptionally used depending on the type of the luminescent layer 60), thus allowing application by the liquid-drop discharge method to be performed, i.e., film formation by the liquid phase process to be performed.

Specifically, it is possible to list precise examples such as LiF and NaF serving as the material used for the formation of the electron transport layer 65B, so that specific producing methods therefor will be described below.

(a) LiF

First, micro particulates, composed of lithium fluoride (LiF) and having diameters substantially on the order of nano meter are produced by the gaseous evaporation method such as the solvent trap method and cold trap method. Then, micro particulates are uniformly dispersed in water to produce a dispersion solution (or colloid).

The aforementioned dispersion solution is applied onto the blue-color luminescent layer composed of the polyfluorene material by the inkjet method (or liquid-drop discharge method), so that its film thickness is approximately set to 5 nm. Herein, no bad influence such as re-dissolution is detected with respect to the luminescent layer 60.

In addition, it is confirmed that the same effect of the LiF film formed by the conventional vacuum evaporation method can be obtained with respect to the electron transport layer 65B made of the LiF film that is formed in the liquid phase process described above.

(b) NaF

Sodium fluoride (NaF) is soluble because of its solubility of 4.15 g per 100 g water (25° C.). Herein, it is unnecessary to prepare micro particulates dispersed into the dispersion solution; therefore, it is possible to realize application using aqueous solution thereof. That is, a saturated solution of NaF is diluted with polyvinyl alcohol (PVA) so as to produce a prescribed solution, which is applied to form a good thin film by the liquid-drop discharge method and the spin-coat method, for example.

By applying the aforementioned solution, which is produced by diluting NaF with PVA, onto the blue-color luminescent layer composed of polyfulorene material, it is confirmed that the electron transport layer 65B can produce expected effects.

The electron transport layer 65RG is composed of an organic metallic complex, which is an organic metallic compound generally expressed by a chemical formula $MA_n$ (where n denotes valence number of a center atom M composed of a metallic element, and A denotes a ligand made of a organic material). As the aforementioned metallic complex, it is possible to use a variety of complexes having various structures such as chelating complex and crown-ether complex.

Specifically, as the ligand A, it is preferable to use β-diketone ligands composed of elements such as acetylacetone (acac), dipipaloil methane (dpm), hexafluoro-acetylacetone (hfa), 2,2,6,6-tetramethyl-3,5-octandioacetone (TMOD), thenoyltrifluoroacetone (TTA), 1-phenyl-3-isohepty-1, and 3-propandion (product name: L1x54, L1x51, produced by Henkel Co. Ltd.); it is preferable to use quinolinolic ligands composed of elements such as 8-quinolinole (oxine), and 2-methyl-8-quinolinole; it is preferable to use phosphoric acid ligands composed of elements such as trioctylhoffmeoxide (TOPO), tributyl phosphate (TBP), isobutylmethylketone (MBK), and bis (2-ethylhexl) phosphate (D2EHPA); and it is preferable to use carboxylic acid ligands composed of elements such as acetic acid and bezonic acid, and diphenylthiocarbazone ligands, for example. Among them, the complex β-diketone ligands (namely, β-diketone complex) correspond to the acid reagent and multidentate ligands using oxygen atoms; therefore, it can be used to form a stable metallic complex.

In order to increase adhesion between the electron transport layer 65RG and the cathode 50, the present embodiment is designed such that the center atom M is composed of the same metallic element of the cathode 50. Herein, the center atom M is required to be identical to the constituent element of the cathode 50 that is positioned in proximity to the interface at the electron transport layer 65RG. In the case in which the cathode 50 is constituted in a laminated structure consisting of plural thin films, the center atom M of the aforementioned complex is required to be identical to the constituent element of the thin film, which is formed closest to the electron transport layer 65RG, within the plural thin films. Specifically, when the cathode 50 is constituted by a single-layer film composed of aluminum (Al), the aforementioned complex is composed of $Al(acac)_2$ whose center atom matches the designated metallic element (i.e., Al). In the case in which the cathode 50 is constituted by a laminated-layer film including Ca and Al, the aforementioned complex is composed of $Ca(acac)_2$ whose center atom matches 'Ca' that is positioned close to the electron transport layer 65RG. In the case in which the cathode 50 is constituted by a co-deposition film including BCP and Cs, the aforementioned complex is composed of Cs(acas), for example.

It is preferable for the cathode 50 to include a prescribed metallic element having a low work function on the interface at the electron transport layer 65RG, details of which will be described later. In this case, the center atom M of the complex is composed of a prescribed metallic element such as alkali metal, alkali earth metal, magnesium, and rare earth element. This complex has a relatively high electron affinity to accelerate electron transport; therefore, it is possible to further increase an efficiency in transporting electrons.

The aforementioned complex can be independently used, or it can be mixed into conventionally-known materials having electron transport ability. As the conventionally-known electron transportable materials, it is possible to list cyclopentadien derivatives, oxadiazole derivatives, bis-styryl-benzene derivatives, p-phenylene compounds, phenanthrolin derivatives, triazole derivatives, and the like. Preferably, the thickness of the electron transport layer 65RG ranges from 0.1 nm to 20 nm in order to secure conductivity.

As shown in FIGS. 3 to 5, the overall area of the cathode 50 is larger than the total of the real display area 4 and the dummy area 5; therefore, the cathode 50 is arranged to comprehensively cover both the real display area 4 and the dummy area 5.

It is preferable to select a prescribed material (e.g., Ca and Mg) having a low work function for the material used for the formation of the lower portion of the cathode 50 positioned close to the luminescent layer 60. On the other hand, another material (e.g., Al) having a high work function is used for the formation of the upper portion (or enclosed side) of the cathode 50. Preferably, the thickness of the cathode 50 ranges from 100 nm to 1000 nm; in particular, it preferably ranges from 200 nm to 500 nm. Because it is a back emission type, the present embodiment does not necessarily adopt light transmissive cathode 50.

As shown in FIG. 5, the circuit layer 11 is arranged beneath the aforementioned luminescence component and is formed on or above the substrate 20. Specifically, a bed mainly composed of $SiO_2$ is formed as a surface protective layer 281 on the surface of the substrate 20; and a silicon layer 241 is formed on the bed. In addition, a gate insulating layer 282 mainly composed of $SiO_2$ and/or SiN is formed on the surface of the silicon layer 241.

The silicon layer 241 contains a channel region 241a that is sandwiched between the gate insulating layers 282 and is arranged to vertically match a gate electrode 242 in position. The gate electrode 242 constructs a part of the aforementioned scan line 101 (not shown). In addition, a first interlayer insulating layer 283 mainly composed of $SiO_2$ is arranged to cover the silicon layer 241 and is formed on the surface of the gate insulating layer 282 providing the gate electrode 242.

A low-concentration source region 241b and a high-concentration source region 241S are arranged in the source side of the channel region 241a inside of the silicon layer 241. In addition, a low-concentration drain region 241c and a high-concentration drain region 241D are arranged in the drain side of the channel region 241a inside of the silicon layer 241. This establishes a so-called light doped drain (LDD) structure. The high-concentration source region 241 is connected to a source electrode 243 via a contact hole 243a that is opened to penetrate through the gate insulating layer 282 and the first interlayer insulating layer 283. The source electrode 243 constructs a part of the aforementioned power supply line 103 (see FIG. 1), which is elongated in a direction three-dimensionally perpendicular to the drawing sheet of FIG. 5 at the position of the source electrode 243. In addition, the high-concentration drain region 241D is connected to a drain electrode 244, which is formed in the same layer of the source electrode 243, via a contact hole 244a that is opened to penetrate through the gate insulating layer 282 and the first interlayer insulating layer 283.

The upper portion of the first interlayer insulating layer 283 in which the source electrode 243 and the drain electrode 244 is covered with a second interlayer insulating layer 284 mainly composed of an acrylic resin component. As the material used for the formation of the second interlayer insulating layer 284, it is possible to use other materials, other than acrylic insulating materials, such as SiN and $SiO_2$. The pixel electrode 23 composed of ITO is formed on the surface of the second interlayer insulating layer 284 and is connected to the drain electrode 244 via a contact hole 23a that is formed to penetrate through the second interlayer insulating layer 284. That is, the pixel electrode 23 is connected to the high-concentration drain region 241D of the silicon layer 241 via the drain electrode 244.

Numerous TFTs (i.e., driving TFTS) are contained in the scan line drive circuit 80 and the inspection circuit 90, wherein n-channel and/or p-channel TFTs are used to constitute inverters included in shift registers. Each of these TFTs has substantially the same structure of the aforementioned driving TFT 123, except that it is not connected with the pixel electrode 23.

The surface of the second interlayer insulating layer 284 on which the pixel electrode 23 is formed is covered with the pixel electrode 23, a lyophilic control layer 25 mainly composed of a lyophilic material such as $SiO_2$, and an organic bank layer 221 composed of acrylic or polyimide. An opening 25a is formed in the lyophilic control layer 25, and an opening 221a is formed in the organic bank layer 221. In each of these openings 25a and 221a, the hole transport layer 70 and the luminescent layer 60 are sequentially laminated in an order counting from the pixel electrode 23. In the present embodiment, the lyophilic control layer 25 has a higher lyophilic property compared with acrylic and polyimide materials forming the organic bank layer 221.

The aforementioned layers ranging from the substrate 20 to the second interlayer insulating layer 284 are collected to form the circuit layer 11.

In order to actualize a color display, the organic electroluminescence device 1 of the present embodiment is designed such that the luminescent layers 60 are formed to suit three primary colors in emission wavelength bands thereof. For example, there are provided a red-color luminescent layer 60R whose emission wavelength band matches red color, a green-color luminescent layer 60G whose emission wavelength band matches green color, and a blue-color luminescent layer 60B whose emission wavelength band matches blue color, which are respectively allocated to display regions R, G, and B. Therefore, a single pixel is constituted by these display regions R, G, and B. A black matrix (BM, not shown) is formed by sputtering metallic chrome in boundaries between colored display regions and is located between the organic bank layer 221 and the lyophilic control layer 25.

Next, a manufacturing method for the organic electroluminescence device 1 of the present embodiment will be described with reference to FIGS. 6A to 6P, each of which is a cross sectional view taken along line A-B in FIG. 2.

Figure 6A:
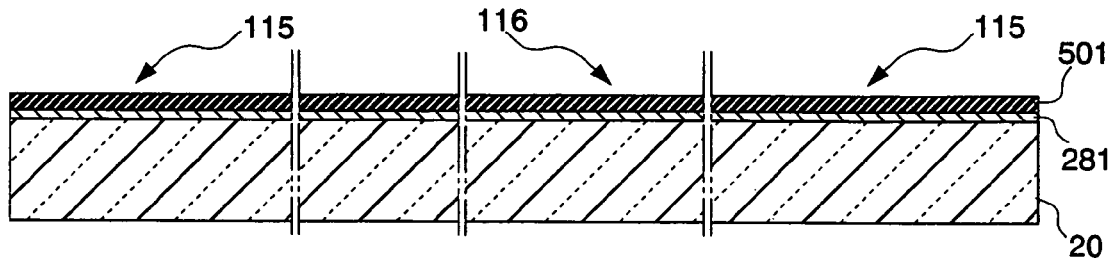
FIG. 6A is a cross sectional view showing a first step of a manufacturing method of the organic electroluminescence device in accordance with the preferred embodiment of the invention, wherein a polysilicon layer is formed on a substrate via a surface protective layer.

First, as shown in FIG. 6A, a surface protective layer 281 is formed on the surface of the substrate 20. Next, amorphous silicon layer 501 is formed on the surface protective layer 281 by the ICVD method or plasma CVD method (where 'CVD' stands for 'chemical-vapor deposition'). Then, the laser annealing method or rapid heating method is performed to cause growth of crystal grains, thus forming a polysilicon layer.

Figure 6B:
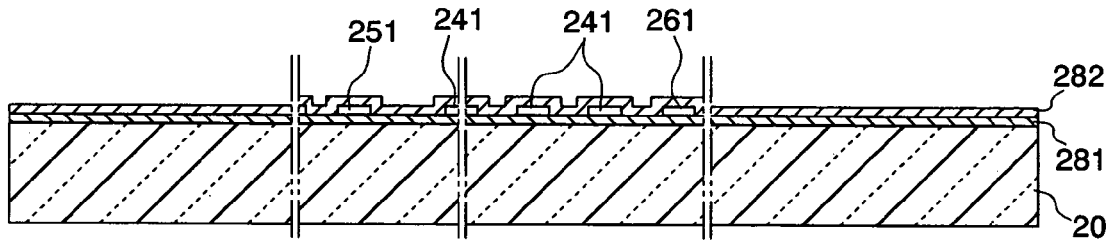
FIG. 6B is a cross sectional view showing a second step of the manufacturing method, wherein the polysilicon layer is subjected to patterning to form silicon layers, which are covered with a gate insulating layer.

Next, as shown in FIG. 6B, the polysilicon layer is subjected to patterning by the photolithography method, thus forming island-like silicon layers 241, 251, and 261. The silicon layers 241 are formed in the aforementioned display area so as to form the driving TFT connected with the pixel electrode 23. The other silicon layers 251 and 261 are respectively used to form p-channel and n-channel TFTs contained in the scan line drive circuit 80.

Next, the plasma CVD method or thermal oxidation method is performed using a silicon oxide film whose thickness approximately ranges from 30 nm to 200 nm so as to form a gate insulating layer 282, which is arranged to cover the overall surface including the silicon layer 241, 251, and 261 and the surface protective layer 281. When the gate insulating layer 282 is formed by the thermal oxidation method, crystallization is performed on the silicon layers 241, 251, and 261, which are thus transformed into polysilicon layers.

When channel doping is performed on the silicon layers 241, 251, and 261, boron ions are implanted at the prescribed timing with a dose rate of about $1\times10^{12}/cm^2$. As a result, the silicon layers 241, 251, and 261 are transformed into low-concentration p-channel silicon layers whose impurity concentration (calculated using impurities after activation annealing) is about $1\times10^{17}/cm^2$.

Next, an ion implantation selection mask is partially formed in channel layers of the p-channel and n-channel TFTs. Then, phosphorus ions are implanted with a dose rate of about $1\times10^{15}/cm^2$. As a result, highly concentrated impurities are introduced into the patterning mask in a self-alignment manner. Thus, as shown in FIG. 6C, a pair of a high-concentration source region 241S and a high-concentration drain region 241D are formed with respect to the silicon layer 241; similarly, a pair of a high-concentration source region 261S and a high-concentration drain region 261D are formed with respect to the silicon layer 261.

Figure 6C:
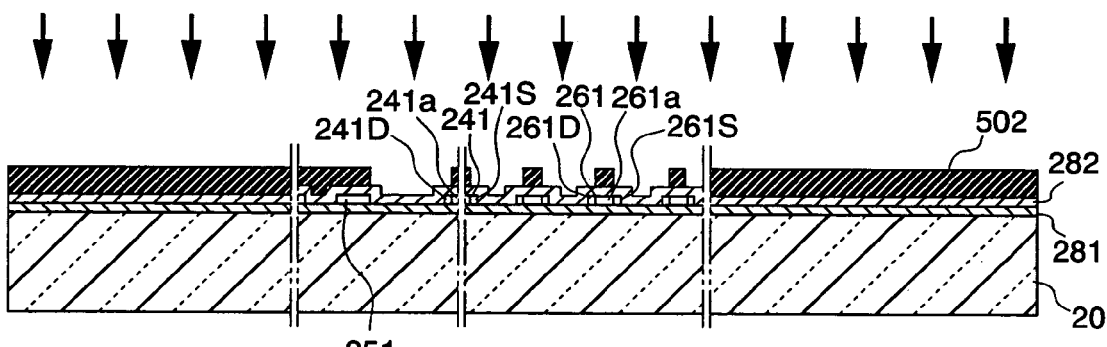
FIG. 6C is a cross sectional view showing a third step of the manufacturing method, wherein source and drain regions are formed with respect to the silicon layers, and a conductive layer is formed to cover the overall surface of the gate insulating layer.
Figure 6D:
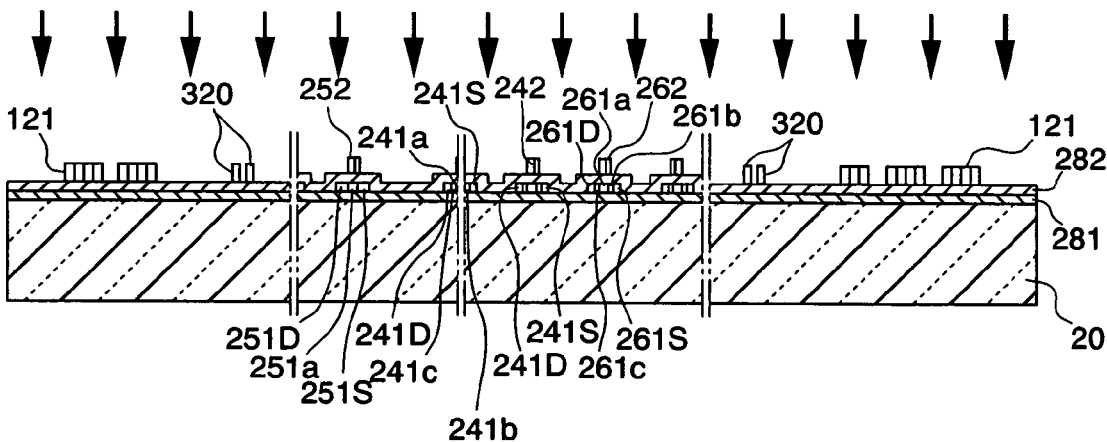
FIG. 6D is a cross sectional view showing a fourth step of the manufacturing method, wherein patterning is performed to form gate electrodes, and cathode power supply lines are simultaneously formed.

As shown in FIG. 6C, the overall surface of the gate insulating layer 282 is then covered with a gate electrode forming conductive layer 502, which is made of a dope silicon film or a silicide film, or which is made of a metal film such as an aluminum film, a chrome film, and a tantalum film. The thickness of the conductive layer 502 is about 500 nm. Then, as shown in FIG. 6D, patterning is performed to form a gate electrode 252 used for the formation of a p-channel driving TFT, a gate electrode 242 used for the formation of a pixel TFT, and a gate electrode 262 used for the formation of an n-channel driving TFT. In addition, drive control signal conductors 320 (or 350) as well as first layers 121 for cathode power source lines are simultaneously formed. In this case, the drive control signal conductors 320 (or 350) are arranged in the dummy area 5.

Subsequently, as shown in FIG. 6D, ion implantation of phosphorus ions is performed using the gate electrodes 242, 252, and 262 as masks on the silicon layers 241, 251, and 261 at a dose rate of about $4\times10^{13}/cm^2$. As a result, lowly concentrated impurities are introduced into the gate electrodes 242, 252, and 262 in a self-alignment manner; therefore, as shown in FIG. 6D, a pair of a low-concentration source region 241b and a low-concentration drain region 241c is formed with respect to the silicon layer 241, and a pair of a low-concentration source region 261b and a low-concentration drain region 261c is formed with respect to the silicon layer 261. In addition, a pair of low-concentration impurity regions 251S and 251D is formed with respect to the silicon layer 251.

Figure 6E:
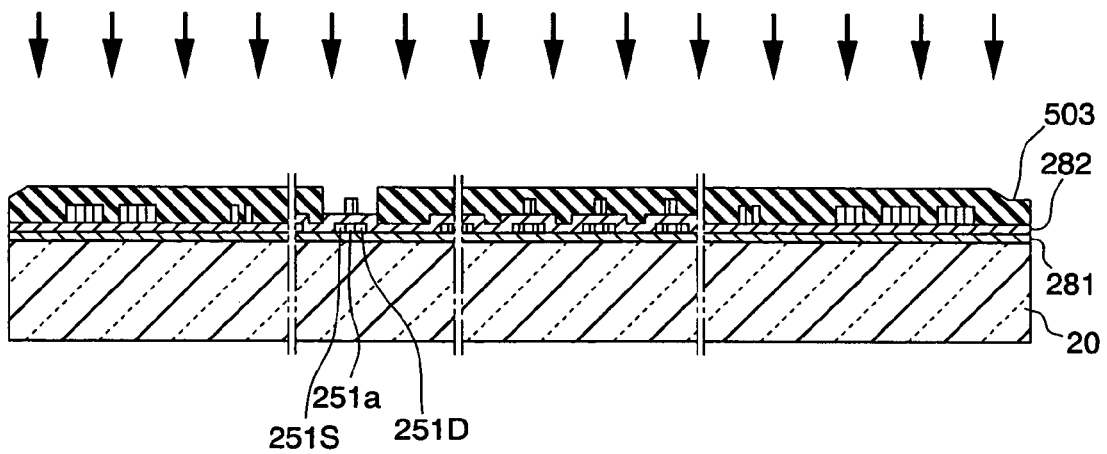
FIG. 6E is a cross sectional view showing a fifth step of the manufacturing method, wherein ion implantation is performed using masks to dope impurities into the silicon layers.

Next, as shown in FIG. 6E, an ion implantation selection mask 503 is formed to cover the overall surface except for a prescribed region regarding the p-channel driving TFT 252. That is, ion implantation is performed using the ion implantation selection mask 503 so that boron ions are introduced into the silicon layer 251 at a dose rate of about $1.5\times10^{15}/cm^2$. Herein, the gate electrode 252 forming a part of the p-channel driving TFT functions as a mask, so that highly concentrated impurities are doped into the silicon layer 252 in a self-alignment manner. Therefore, both of the low-concentration impurity regions 251S and 251D are counter-doped so as to form a source region and a drain region for the p-channel driving TFT.

Figure 6F:
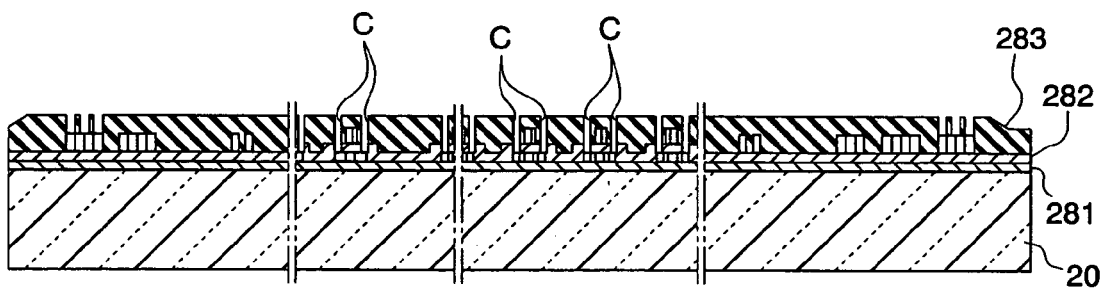
FIG. 6F is a cross sectional view showing a sixth step of the manufacturing method, wherein a first interlayer insulating layer is formed to cover the overall surface of the substrate and is subjected to patterning by photolithography, thus forming contact holes at prescribed positions in correspondence with source and drain electrodes.

Next, as shown in FIG. 6F, a first interlayer insulating layer 283 is formed on the overall surface of the substrate 20 and is then subjected to patterning by the photolithography method, so that contact holes C are formed at prescribed positions matching source electrodes and drain electrodes of TFTs.

Figure 6G:
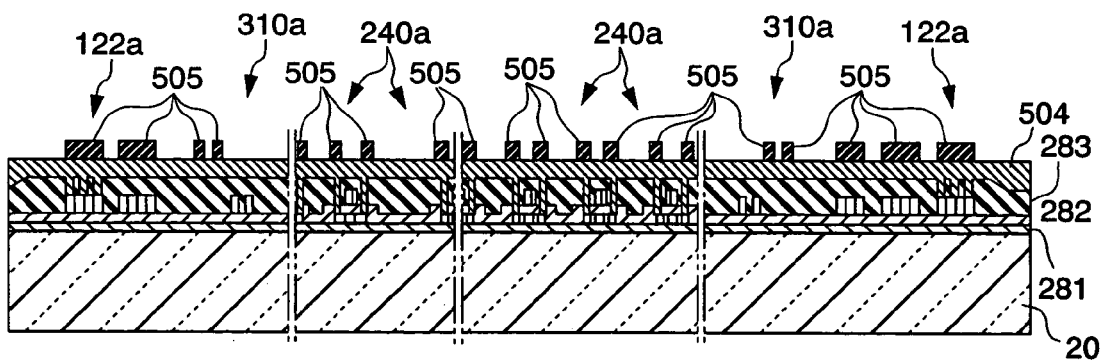
FIG. 6G is a cross sectional view showing a seventh step of the manufacturing method, wherein a conductive layer is formed to cover the first interlayer insulating layer.
Figure 6H:
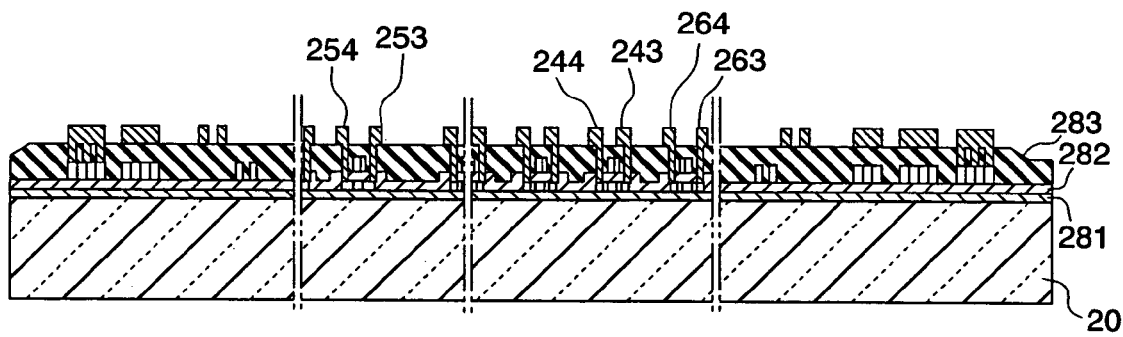
FIG. 6H is a cross sectional view showing an eighth step of the manufacturing method, wherein the conductive layer is subjected to patterning using masks to form source and drain electrodes.

Next, as shown in FIG. 6G, a conductive layer 504 composed of a prescribed metal such as aluminum, chrome, and tantalum is formed to cover the first interlayer insulating layer 283. The thickness of the conductive layer 504 approximately ranges from 200 nm to 800 nm. Then, patterning masks 505 are formed to cover regions 240a used for the formation of source electrodes and drain electrodes of TFTs, regions 310a used for the formation of drive voltage conductors 310 (or 340), and regions 122a used for the formation of second layers of cathode power source lines within the conductive layer 504. In addition, the conductive layer 504 is subjected to patterning so as to form source electrodes 243, 253, and 263 as well as drain electrodes 244, 254, and 264 as shown in FIG. 6H.

Figure 6I:
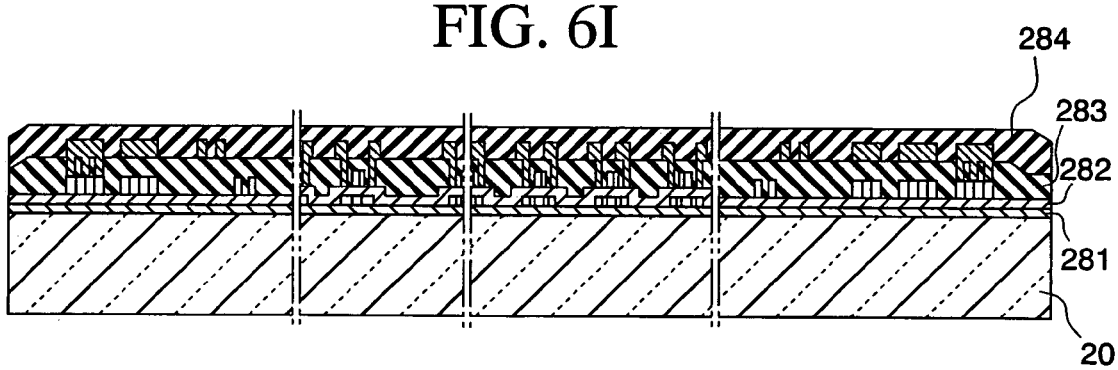
FIG. 6I is a cross sectional view showing a ninth step of the manufacturing method, wherein a second interlayer insulating layer is formed to cover the first interlayer insulating layer.

Next, as shown in FIG. 6I, a second interlayer insulating layer 284 composed of a prescribed polymer material such as an acrylic resin is formed to cover the first interlayer insulating layer 283 containing the aforementioned elements. It is preferable that the thickness of the second interlayer insulating layer 284 approximately range from 1 μm to 2 μm. Instead, it is possible to form a second interlayer insulating film composed of SiN or $SiO_2$. Herein, the thickness of the SiN film is preferably set to 200 nm, and the thickness of the $SiO_2$ film is preferably set to 800 nm.

Figure 6J:
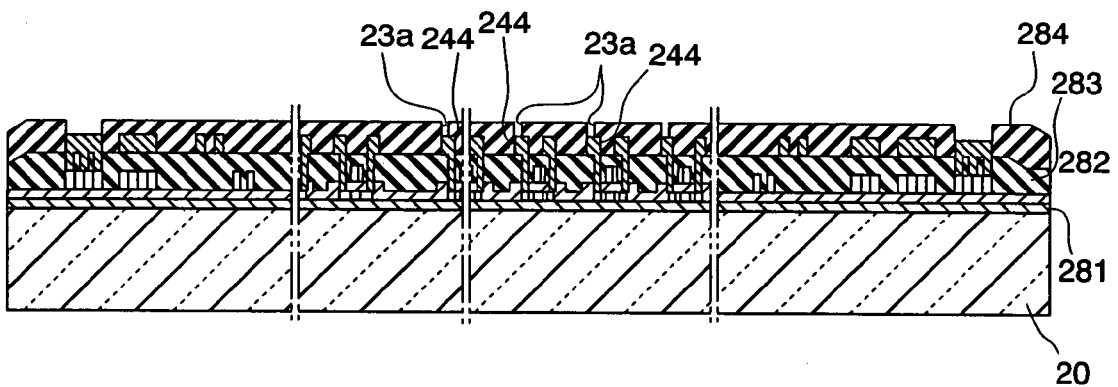
FIG. 6J is a cross sectional view showing a tenth step of the manufacturing method, wherein contact holes are formed to penetrate through the second interlayer insulating layer by etching in correspondence with drain electrodes.

Next, as shown in FIG. 6J, regions corresponding to the drain regions 244 for the driving TFTs within the second interlayer insulating layer 284 are removed by etching so as to form the contact holes 23a.

Figure 6K:
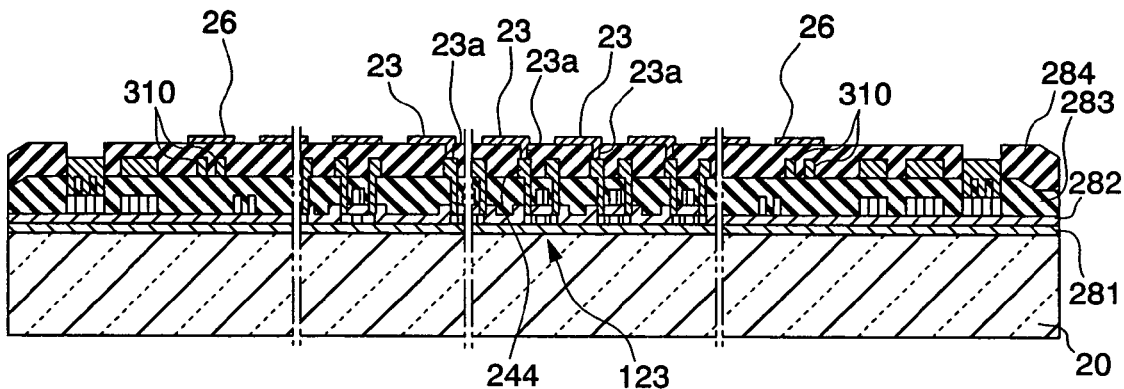
FIG. 6K is a cross sectional view showing an eleventh step of the manufacturing method, wherein a transparent conductive layer covering the overall surface of the substrate is subjected to patterning to form pixel electrodes and dummy patterns.

Then, a transparent conductive film forming pixel electrodes 23 is formed to cover the overall surface of the substrate 20. The transparent conductive film is subjected to patterning so as to form the pixel electrodes 23, which are electrically conducted with the drain electrodes 244 via the contact holes 23a in the second interlayer insulating layer 284, and dummy patterns 26 for the dummy area as shown in FIG. 6K. For the sake of convenience, in FIGS. 3 and 4, the pixel electrodes 23 and the dummy patterns 26 are collectively expressed as the pixel electrodes 23.

The dummy patterns 26 are constituted not to be connected with metal wires arranged thereunder via the second interlayer insulating layer 284. That is, the dummy patterns 26 are arranged like islands, which may substantially match the shape of the pixel electrodes 23 arranged in the real display area. Of course, they can be formed in another shape that differs from the shape of the pixel electrodes 23 arranged in the real display area. In this case, the dummy patterns 26 should include at least certain regions located above the drive voltage conductors 310 (or 340).

Figure 6L:
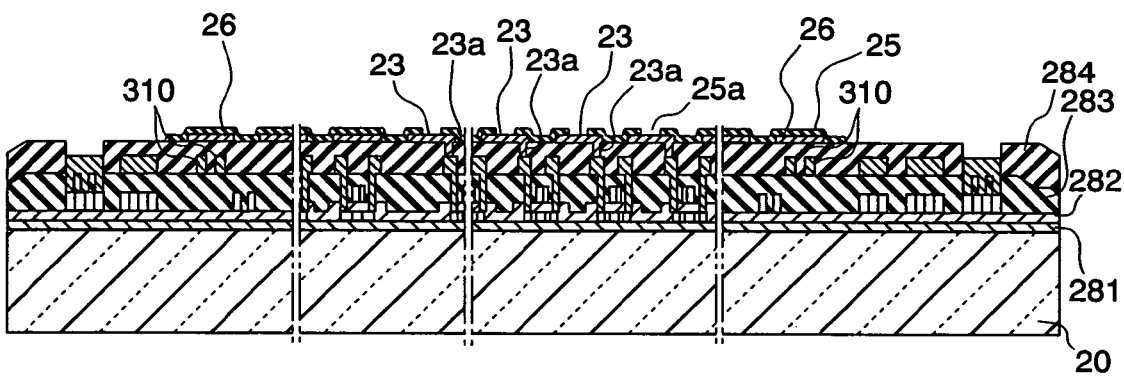
FIG. 6L is a cross sectional view showing a twelfth step of the manufacturing method, wherein a lyophilic control layer is formed to cover the pixel electrodes and dummy patterns on the second interlayer insulating layer.

Next, as shown in FIG. 6L, a lyophilic control layer 25 serving as an insulating layer is formed on the pixel electrodes 23 and the dummy patterns 26 as well as on the second interlayer insulating layer 284. When the lyophilic control layer 25 is formed such that openings are formed at the pixel electrodes, it is possible for electrons to move from the pixel electrodes 23 in the openings 25a (see FIG. 3 and FIG. 9M). In contrast, when the dummy patterns 26 do not provide the openings 25a, the lyophilic control layer (or insulating layer) 25 acts as a hole movement block layer to avoid hole movement. Subsequently, a black matrix (BM, not shown) is formed and arranged in hollows that are formed in the lyophilic control layer 25 and are positioned between adjacent pixel electrodes. Specifically, sputtering is performed using metallic chrome with respect to the hollows of the lyophilic control layer 25, thus forming prescribed films.

Figure 6M:
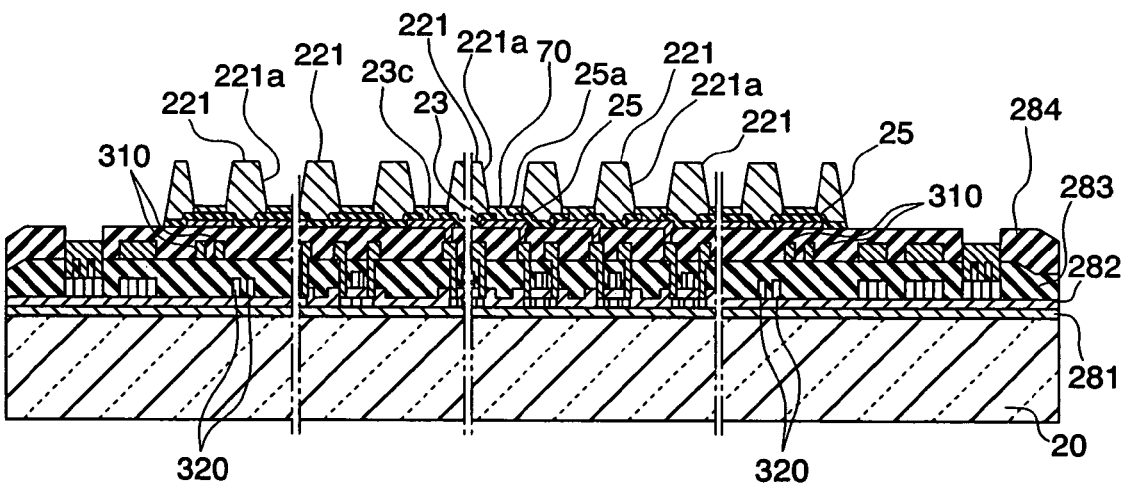
FIG. 6M is a cross sectional view showing a thirteenth step of the manufacturing method, wherein organic layers are subjected to patterning by photolithography or etching so as to form organic bank layers at prescribed positions of the lyophilic control layer and are then subjected to plasma treatment, and wherein hole transport layers are formed by liquid-drop discharging, drying, and heating.

Next, as shown in FIG. 6M, organic bank layers 221 are formed at prescribed positions of the lyophilic control layer 25 so as to cover the aforementioned black matrix (BM). Specifically, the organic bank layers 221 are formed in such a way that solution, in which resists composed of acrylic resin or polyimide resin are dissolved into solvent, is applied in accordance with one of various application methods such as spin-coat method and dip-coat method, thus forming organic layers. Incidentally, the material constituting organic layers can be selected from among various materials that are not dissolved into solvent such as ink and that can be easily patterned by etching.

Subsequently, the organic layers are subjected to patterning by use of the photolithography technique or etching technique so that bank openings 221a are formed in the organic layers, wherein the wall surfaces of the organic bank layers 221 are located in the bank openings 221a. In this case, the organic bank layers 221a must contain at least certain regions located above the aforementioned drive control signal conductors 320.

Next, lyophilic regions and lyophobic regions are formed on the surfaces of the organic bank layers 221. In the present embodiment, these regions are formed by plasma treatment, which comprises four steps; that is, a preheating step, an ink-lyophilic step for making upper surfaces of the organic bank layers 221, wall surfaces of the openings 221a, electrode surfaces 23c of the pixel electrodes 23, and the upper surface of the lyophilic control layer 25 to be lyophilic with ink, an ink-lyophobic step for making upper surfaces of the organic bank layers 221, and wall surfaces of the openings 221a to be lyophobic with ink, and a cooling step.

That is, a prescribed base material (i.e., the substrate 20 including banks) is heated at a prescribed temperature ranging from 70° C. to 80° C., for example; then, as the ink-lyophilic step, a plasma process (i.e., $O_2$ plasma process) is performed using oxygen as reaction gas in the open-air atmosphere. Then, as the ink-lyophobic step, a plasma process (i.e., $CF_4$ plasma process) is performed using methane tetrafluoride as reaction gas in the open-air atmosphere. Thereafter, the base material that is once heated in the plasma processes is cooled down to the room temperature, so that lyophilic property and lyophobic property can be imparted to prescribed regions.

Incidentally, the electrode surfaces 23c of the pixel electrodes 23 and the lyophilic control layer 25 may be slightly affected by the $CF_4$ plasma process. However, since both of ITO, which is the designated material for the pixel electrodes 23, and $SiO_2$ or $TiO_2$, which is the designated material for the lyophilic control layer 25, have poor lyophilic property against fluorine, it is possible to maintain the lyophilic property in the pixel electrodes 23 and the lyophilic control layer 25 because hydroxyl group applied in the ink-lyophilic step is not replaced with fluorine group.

Next, a hole transport layer forming process is performed to form the hole transport layer 70. As the hole transport layer forming process, it is possible to use a manufacturing method in which a thin film is formed in a thickness ranging from several nano meters to several hundreds of nano meters in a liquid phase process. In the liquid phase process, a prescribed material used for the formation of a thin film is dissolved or dispersed to create a liquid matter, which is then subjected to the spin-coat method, dip method, or liquid-drop discharge method (or inkjet method) so as to produce the thin film. Herein, the spin-coat method and dip method are suited to the overall surface application, while the liquid-drop discharge method enables the thin film to be subjected to patterning at a prescribed location. For this reason, it is preferable in the hole transport layer forming process to use the liquid-drop discharge method, by which the hole transport layer forming material is applied onto the electrode surfaces 23c.

In the case in which the selective application of the hole transport layer forming material is performed by the liquid-drop discharge method (or inkjet method), a liquid-drop discharge head (not shown) is firstly filled with the hole transport layer forming material; then, a discharge nozzle thereof is positioned to be opposite to the electrode surface 23c, which is located in the opening 25a of the lyophilic control layer 25. While the liquid-drop discharge head and the base material (i.e., substrate 20) are being moved relative to each other, the discharge nozzle discharges liquid drops, each of which is controlled in value, towards the electrode surface 23c.

Thereafter, a drying process and a heating process are performed so as to evaporate the dispersion medium and/or solvent contained in the hole transport layer forming material, so that a thin film whose thickness ranges from several nano meters to several hundreds of nano meters is formed as the hole transport layer 70 on the electrode surface 23c. Preferably, the drying process is performed in the nitrogen atmosphere at the room temperature under the prescribed pressure of about 133.3 Pa (1 Torr). After the drying process, the heating process is performed preferably in the vacuum state at 200° C. for ten minutes or so.

Liquid drops discharged from the discharge nozzle are spread on the electrode surface 23c, on which the lyophilic process was performed, so that they fill the opening 25a of the lyophilic control layer 25. On the other hand, liquid drops are repelled and not adhered on the upper surface of the organic bank layer 221, on which the lyophobic process was performed. Therefore, even when liquid drops deviate a prescribed discharged position and are unexpectedly discharged onto the upper surface of the organic bank layer 221, the upper surface of the organic bank layer 221 is not made wet so that repelled liquid drops may fall inside of the opening 25a of the lyophilic control layer 25.

After completion of the hole transport layer forming process, in order to avoid oxidation of the hole transport layer 70 and the luminescent layer 60, the subsequent processes are preferably performed in inert gas atmosphere such as a nitrogen atmosphere and an argon atmosphere.

Figure 6N:
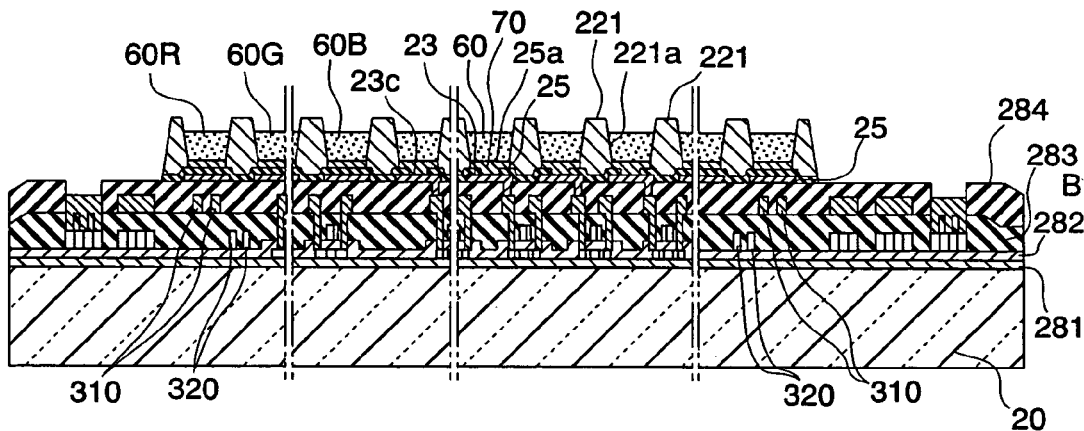
FIG. 6N is a cross sectional view showing a fourteenth step of the manufacturing method, wherein luminescent layers are formed by liquid-drop discharging, drying, and heating inside of openings of organic bank layers.

Next, as shown in FIG. 6N, a luminescent layer forming process is performed to form the luminescent layer 60. In the luminescent layer forming process, the aforementioned liquid-drop discharge method is performed to discharge a luminescent layer forming material onto the hole transport layer 70; then, a drying process and a heating process are performed to form the luminescent layer 60 in the opening 221a of the organic bank layer 221. In the luminescent layer forming process, in order to avoid re-dissolution of the hole transport layer 70, the aforementioned nonpolar solvent insoluble to the hole transport layer 70 is used as solvent for use in the luminescent layer forming material.

Specifically, in the luminescent layer forming process, the aforementioned liquid-drop discharge method is used to selectively apply a blue-color luminescent layer forming material to blue-color display regions, which are then subjected to a drying process. Similarly, the liquid-drop discharge method is performed so as to respectively apply green-color and red-color luminescent layer forming materials to green-color and red-color display regions, which are then subjected to drying processes. In the case in which the liquid-drop discharge method is used to apply the aforementioned material to the designated color display regions, the drying process is performed in such a way that the substrate is heated on a hot plate (not shown) at a prescribed temperature, which is 200° C. or less, so that liquid content is dried and evaporated. In the case in which the spin-coat method or dip method is performed to apply the aforementioned material to the designated color display regions, nitrogen is sprayed onto the substrate, or the substrate is rotated to cause air flow on the surface thereof and is thus dried.

Figure 6O:
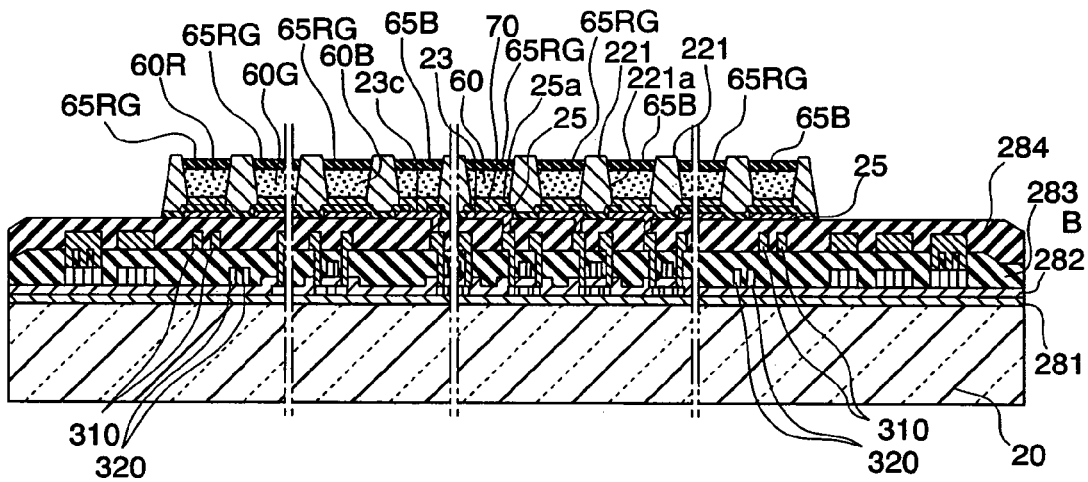
FIG. 6O is a cross sectional view showing a fifteenth step of the manufacturing method, wherein electron transport layers are formed by liquid-drop discharging, drying, and heating inside of openings of organic bank layers.

Next, as shown in FIG. 6O, an electron transport layer forming process is performed to form the electron transport layers 65B and 65RG. In the electron transport layer forming process, the aforementioned liquid-drop discharge method is performed to discharge the electron transport layer forming material.

In order to form the electron transport layers 65B, an LiF dispersion solution or a NaF aqueous solution is discharged selectively onto the blue-color luminescent layers 60 and are then subjected to drying and heating processes, so that the electron transport layers 65B are formed inside of the openings 221a of the organic bank layers 221. In this electron transport layer forming process, in order to avoid re-dissolution of the luminescent layers 60, a nonpolar solvent insoluble to the luminescent layers 60 is used as the solvent for use in the electron transport layer forming material.

An organic metallic complex whose center atom matches the constituent element (e.g., Ca) of the cathode 50 is used in the formation of the electron transport layers 65RG. Specifically, the aforementioned metallic complex (e.g., $Ca(acac)_2$) is dissolved into solvent, which is then discharged into the openings 221a of the organic bank layers 221, thus forming the electron transport layers 65RG.

In this electron transport layer forming process, the electron transport layer forming material is subjected to application and is then subjected to the drying process, in which the substrate is heated on a hot plate (not shown) at a prescribed temperature, which is 200° C. or less, and is thus dried so that water content is evaporated.

Next, as shown in FIG. 10P, a cathode layer forming process is performed to form the cathode 50, wherein a prescribed cathode material such as aluminum (Al) is transformed into a film by evaporation or sputtering, for example.

Thereafter, an enclosing process is performed to form the encapsulating substrate 30, wherein a dryer (or a drying agent) 45 is attached to the interior wall of the encapsulating substrate 30 in order to prevent water or oxygen from penetrating into the organic electroluminescence device; then, the space formed between the substrate 20 and the encapsulating substrate 30 is enclosed by the enclosing resin 40. A thermosetting resin or an ultraviolet-setting resin is used for the enclosing resin 40. Incidentally, the enclosing process is preferably performed in the inert gas atmosphere such as nitrogen, argon, and helium.

Figure 6P:
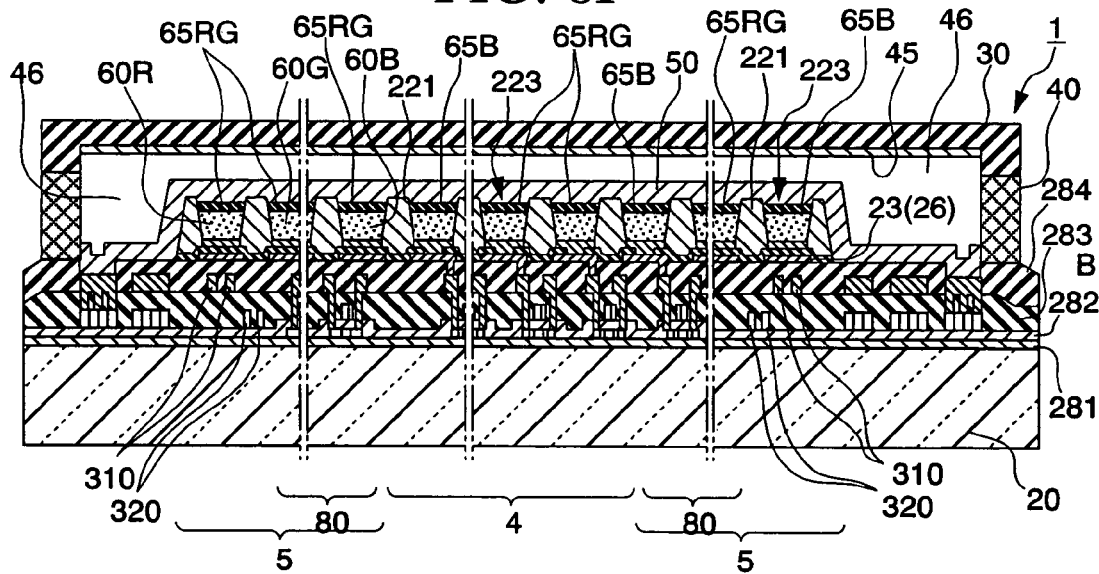
FIG. 6P is a cross sectional view showing a sixteenth step of the manufacturing method, wherein a cathode is formed by evaporation or sputtering using aluminum, and an encapsulating substrate is also formed to encapsulate components and elements on the substrate.

As a result, the organic electroluminescence device 1 is manufactured by the aforementioned steps and processes shown in FIGS. 6A to 6P. Herein, it is certainly confirmed that when applying voltage of 10 V or less between both electrodes (namely, the anode and cathode), in particular, blue-color light is preferably emitted from the pixel electrode 23.

In the manufacture of the organic electroluminescence device 1, the electron transport layers 65B are formed using the LiF dispersion solution or NaF aqueous solution as the electron transport layer forming material therefor; and the electron transport layers 65RG are formed using the liquid matter, in which the metallic complex (e.g., $Ca(acac)_2$) is dissolved into the solvent, as the electron transport layer forming material therefor. This allows the electron transport layers 65B and 65RG to be reliably formed in the liquid phase process. Therefore, it is possible to eliminate the foregoing drawbacks, which are caused in the case of the formation in the gaseous phase process, such as unwanted cost increase, and unwanted exposure of the organic bed material and substrate in high-temperature environments.

In short, the manufacturing method of this invention is advantageous in efficiency and cost in manufacture and is readily adopted in mass production, wherein it is in particular effective in manufacture of large-screen displays whose substrate sizes are not necessarily limited because of the adoption of the liquid-drop discharge method. In addition, this manufacturing method does not need evaporation masks, which contributes to manufacture of high-resolution and fine displays. Furthermore, this manufacturing method will effectively accelerate developments for flexible displays using plastic substrates having low heat resistances.

Since the electron transport layer forming materials are applied to the liquid-drop discharge method, they can be selectively located and applied to prescribed positions. Specifically, the LiF dispersion solution can be selectively applied onto the blue-color luminescent layer 60B so as to form the electron transport layer 65B, and the liquid matter including the metallic complex $Ca(acac)_2$ can be selectively applied onto the red-color and green-color luminescent layer 60RG so as to form the electron transport layer 65RG. Thus, it is possible to form red-color, green-color, and blue-color luminescence components having high luminance at a high efficiency.

In the organic electroluminescence device 1, the electron transport layers 65B and 65GR are separately formed on the luminescent layers 60 emitting different colors in order to cope with differences of heights of charge injection barriers between the cathode 50 and the luminescent layers 60 emitting red, green, and blue colors respectively. This increases an electron transport efficiency with respect to each of the luminescent layers 60 emitting red, green, and blue colors respectively. In summary, the organic electroluminescence device 1 is superior in luminescence characteristics due to high luminance and high efficiency in light emission of luminescence components.

The present embodiment is described as the back emission type. Of course, this invention is not necessarily limited to the back emission type and can be easily applied to the top emission type. In addition, this invention can be applied to the other type of display in which light is emitted from both sides.

Next, an electronic device incorporating the aforementioned organic electroluminescence device will be described with reference to FIG. 7, which shows the exterior appearance of a portable telephone (or a cellular phone).

Figure 7:
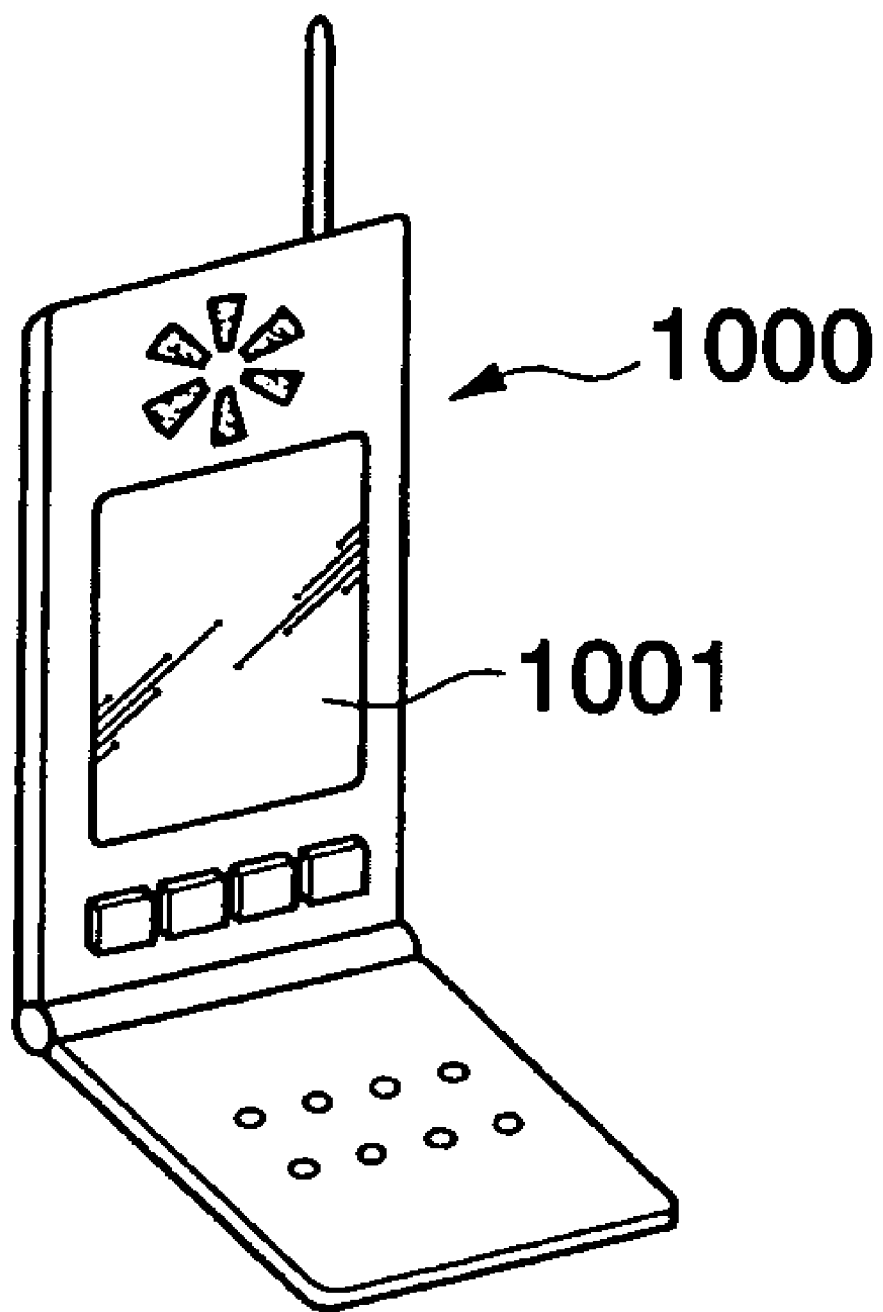
FIG. 7 is a perspective view showing an exterior appearance of an electronic device such as a portable telephone including the organic electroluminescence device.

In FIG. 7, reference numeral 1000 designates the main body (or housing) of the portable telephone, and reference numeral 1001 designates a display incorporating the aforementioned organic electroluminescence device.

Since the electronic device of FIG. 7 comprises the display 1001 incorporating the organic electroluminescence device, the display 1001 demonstrates high display characteristics and may satisfy user's preference in visibility.

As described heretofore, this invention has a variety of effects and technical features, which will be described below.

(1) An organic electroluminescence device of this invention basically comprises luminescent layers arranged between an anode and a cathode, which are arranged opposite to each other, wherein electron transport layer forming materials are introduced in the liquid phase process so as to form electron transport layers, which are arranged between the luminescent layers and the cathode. Since electron transport layers are formed in the liquid phase process, it is possible to eliminate problems, which occur in the case of formation in the gaseous process, such as unwanted cost increase and unwanted exposure of organic bed materials and substrates in high-temperature environments. Incidentally, electron transport layers have electron transport ability and hole blocking ability for blocking movements of holes, which are thus maintained in luminescent layers.

(2) As electron transport layer forming materials, it is possible to use prescribed elements such as alkali metals, alkali earth metals, and halides or oxides of rare earth metals.

(3) Alternatively, it is possible to use dispersion solution, in which LiF particulates are dispersed, as the electron transport layer forming material. Conventionally, LiF produces good results when used as the material for the formation of electron transport layers for luminescent layers emitting blue-clor light, wherein it is hardly dissolved into water or other solvent, so that the formation of electron transport layers using LiF can be performed in the gaseous process such as the vacuum evaporation but have not been performed in the liquid phase process. In this invention, LiF is transformed into micro particulates (or micro grains) whose diameters are 1 μm or less, which are dispersed into polar solvent (or dispersion medium) such as water so as to produce a liquid matter, which is then subjected to the liquid-drop discharge method so that liquid drops are selectively located and discharged at prescribed positions. This allows formation of electron transport layers using LiF to be achieved in the liquid phase process. Thus, it is possible to reliably produce the organic electroluminescence device having good luminescence characteristics while avoiding occurrence of the aforementioned problems.

(4) As the electron transport layer forming material, it is possible to use prescribed elements such as alkali metals, alkali earth metals, and halides or oxides of rare earth metals, which are dissolved into water to produce an aqueous solution. This is because the aqueous solution does not dissolve the luminescent layers even when the nonpolar solvent is used for the material used for the formation of the luminescent layers. Thus, it is possible to reliably form the electron transport layers in the liquid phase process without deteriorating characteristics of the luminescent layers.

(5) The designated luminescent layers are designed to emit blue color. That is, the electron transport layers including prescribed elements such as alkali metals, alkali earth metals, and halides or oxides of rare earth metals are arranged on or above the blue-color luminescent layers. Due to a relatively low work function of the prescribed elements used for the formation of the electron transport layers, it is possible to noticeably improve an emission efficiency in the blue-color luminescent layers.

(6) As the electron transport layer forming material, it is possible to use organic metallic complex, by which electron transport layers are formed in the liquid phase process. For example, the organic metallic complex is β-diketone complex. That is, the electron transport layers using the organic metallic complex can increase adhesion at both of the interface of the cathode made of a prescribed metal and the interface of the luminescent layer made of a prescribed organic substance. This increases an emission efficiency of the luminescent layer. The organic metallic complex is an organic metallic compound generally expressed in a chemical formula of $MA_n$ (where M denotes a center atom composed of a metallic element; A denotes a ligand composed of an organic element; and n denotes valence number of the center atom M). As the ligand A, it is preferable to use acetylacetone (acac). As the center atom M, it is preferable to use a metal having a relatively small work function, such as calcium (Ca) in particular.

(7) The other luminescent layers are designed to emit red color or green color. That is, the electron transport layers composed of the organic metallic complex are formed on or above the red-color or green-color luminescent layers. They increase adhesion at both of the interface of the cathode made of a prescribed metal and the interface of the luminescent layers made of a prescribed organic substance; thus, it is possible to noticeably improve an emission efficiency in the luminescent layers.

(8) The thickness of the electron transport layer preferably ranges from 0.1 nm to 20 nm. This guarantees good conductivity and improves emission efficiency in the luminescent layer.

(9) In order to realize a full-color display using three primary colors (i.e., blue, green, and red), a first material including a prescribed element such as alkali metal, alkali earth metal, and halide or oxide of rare earth metal is subjected to the liquid phase process to form an electron transport layer on a blue-color luminescent layer, while a second material including an organic metallic complex is subjected to the liquid phase process to form electron transport layers on green-color and red-color luminescent layers. Due to a relatively low work function of the first material, it is possible to noticeably improve an emission efficiency in the blue-color luminescent layer. Since the second material can increase adhesion at both of the interface of the cathode and the interface of the luminescent layer(s), it is possible to noticeably improve emission efficiencies in the green-color and red-color luminescent layers. Because of improvements of emission efficiencies in all of the blue-color, green-color, and red-color luminescent layers, it is possible to actualize a high contrast and a good gradation in a full-color display using the aforementioned organic electroluminescence device.

(10) Moreover, a variety of electronic devices (e.g., portable telephones) can be produced using the aforementioned organic electroluminescence device, which can reliably eliminate problems such as high manufacturing cost and unwanted exposure of organic bed materials and substrates in high-temperature environments due to the gaseous process. Therefore, it is possible to produce electronic devices having high reliability at a relatively low cost.

As this invention may be embodied in several forms without departing from the spirit or essential characteristics thereof, the present embodiment and its related examples are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

The invention claimed is:

1. A method of manufacturing an organic electroluminescence device, the method comprising:
   forming a first anode;
   forming a second anode;
   forming a third anode;
   forming a blue-color luminescent layer over the first anode;
   forming a green-color luminescent layer over the second anode;
   forming a red-color luminescent layer over the third anode;
   applying a first liquid material over the blue-color luminescent layer, the first liquid material including at least a component which is selected from among a halide or an oxide of an alkali metal, an alkali earth metal, and a rare earth metal;
   applying a second liquid material over the green-color luminescent layer the second liquid material including at least a first organic metallic complex or a first organic compound; and
   applying a third liquid material over the red-color luminescent layer, the third material including at least a second organic metallic complex or a second organic compound.

2. The method of manufacturing an organic electroluminescence device according to claim 1, wherein the first liquid material is a dispersion liquid in which LiF particulates are dispersed.

3. The method of manufacturing an organic electroluminescence device according to claim 1, wherein at least one of the first and the second organic metallic complexes is β-diketone complex.

4. The method of manufacturing an organic electroluminescence device according to claim 1, wherein the first liquid material is applied by a liquid-drop discharge method.

5. A method of manufacturing an organic electroluminescence device, the method comprising:
   forming a first anode;
   forming a second anode;
   forming a first luminescent layer over the first anode;
   forming a second luminescent layer over the second anode;
   applying a first liquid material over the first luminescent layer, the first liquid material including at least a component which is selected from among a halide or an oxide of an alkali metal, an alkali earth metal, and a rare earth metal; and
   applying a second liquid material over the second luminescent layer, the second liquid material including at least an organic metallic complex or an organic compound.

6. The method of manufacturing an organic electroluminescence device according to claim 5, further comprising: forming a first electron transport layer over the first luminescent layer by the application of the first liquid material; and forming a second electron transport layer over the second luminescent layer by the application of the second liquid material.

7. The method of manufacturing an organic electroluminescence device according to claim 5, wherein the organic compound includes a p-phenylene compound.

* * * * *